(12) United States Patent
Park et al.

(10) Patent No.: US 8,178,442 B2
(45) Date of Patent: May 15, 2012

(54) METHOD OF FORMING PATTERNS OF SEMICONDUCTOR DEVICE

(75) Inventors: Sang-yong Park, Suwon-si (KR);
Jae-kwan Park, Suwon-si (KR);
Dong-hwa Kwak, Suwon-si (KR);
Byung-kwan You, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 500 days.

(21) Appl. No.: 12/501,515

(22) Filed: Jul. 13, 2009

(65) Prior Publication Data

US 2010/0093173 A1    Apr. 15, 2010

(30) Foreign Application Priority Data

Oct. 12, 2008 (KR) .................. 10-2008-0104264

(51) Int. Cl.
*H01L 21/311* (2006.01)
(52) U.S. Cl. .......................... 438/696; 216/46
(58) Field of Classification Search .............. 216/46; 438/696
See application file for complete search history.

(56) References Cited

U.S. PATENT DOCUMENTS 6,723,607 B2 *  4/2004  Nam et al. ............ 438/275
7,115,525 B2   10/2006  Abatchev et al.

FOREIGN PATENT DOCUMENTS

| JP | 2006-351861 | 12/2006 |
| KR | 1020080029021 A | 4/2008 |

* cited by examiner

*Primary Examiner* — Roberts Culbert
(74) *Attorney, Agent, or Firm* — Volentine & Whitt, PLLC

(57) ABSTRACT

A method in the fabrication of a semiconductor device simultaneously forms different patterns on the same level of the device. The device has a first area and a second area. A low density mask pattern of at least one relatively wide topographic feature is formed on the second area, a plurality of relatively narrow topographic features is formed on the first area, first spacers are formed on side walls of the narrow topographic features in the first area, the relatively narrow topographic features are removed, and the patterns of the first spacers and the relatively wide topographic feature(s) are simultaneously transcribed in the first and second areas, respectively.

20 Claims, 28 Drawing Sheets

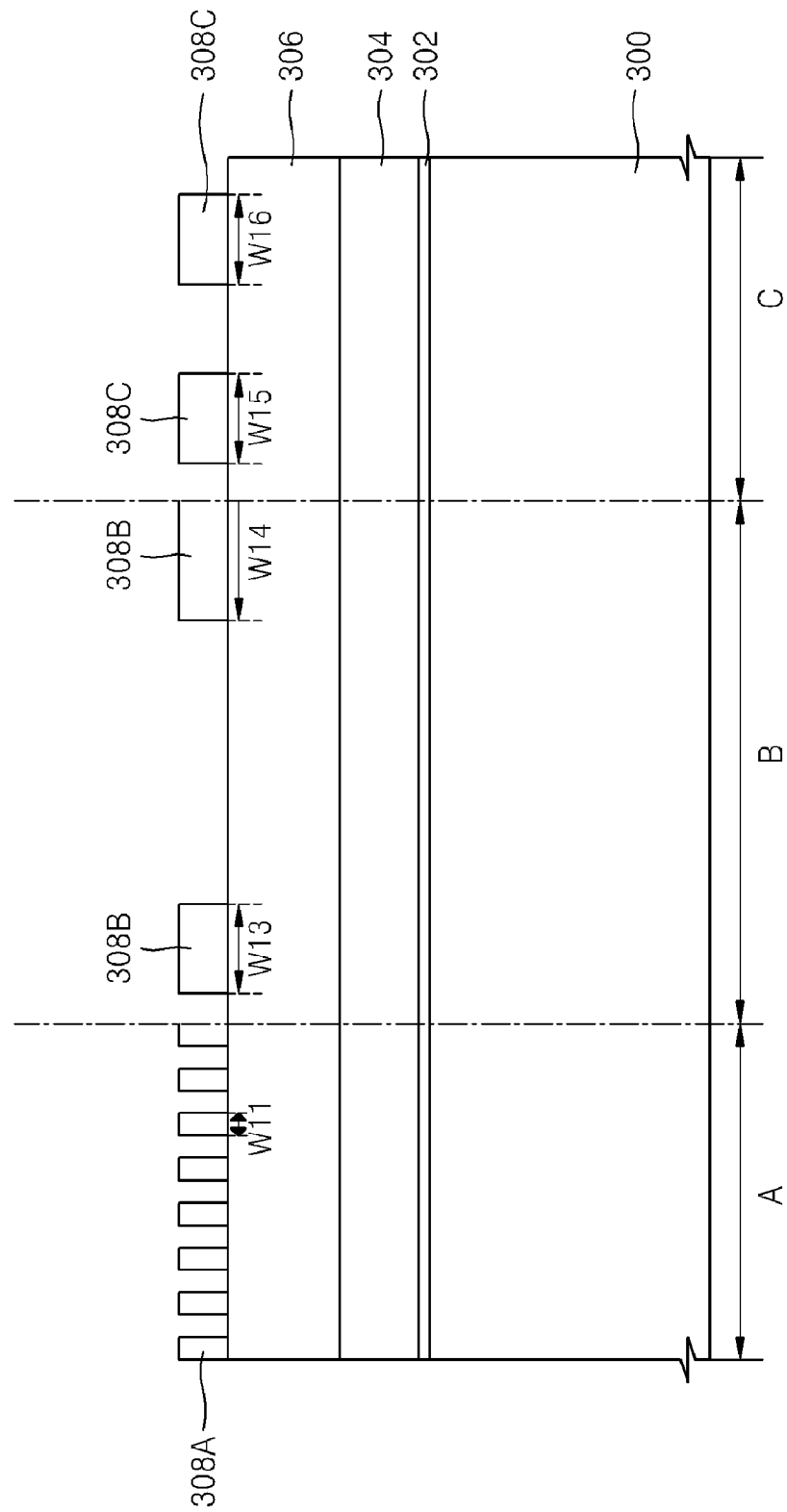

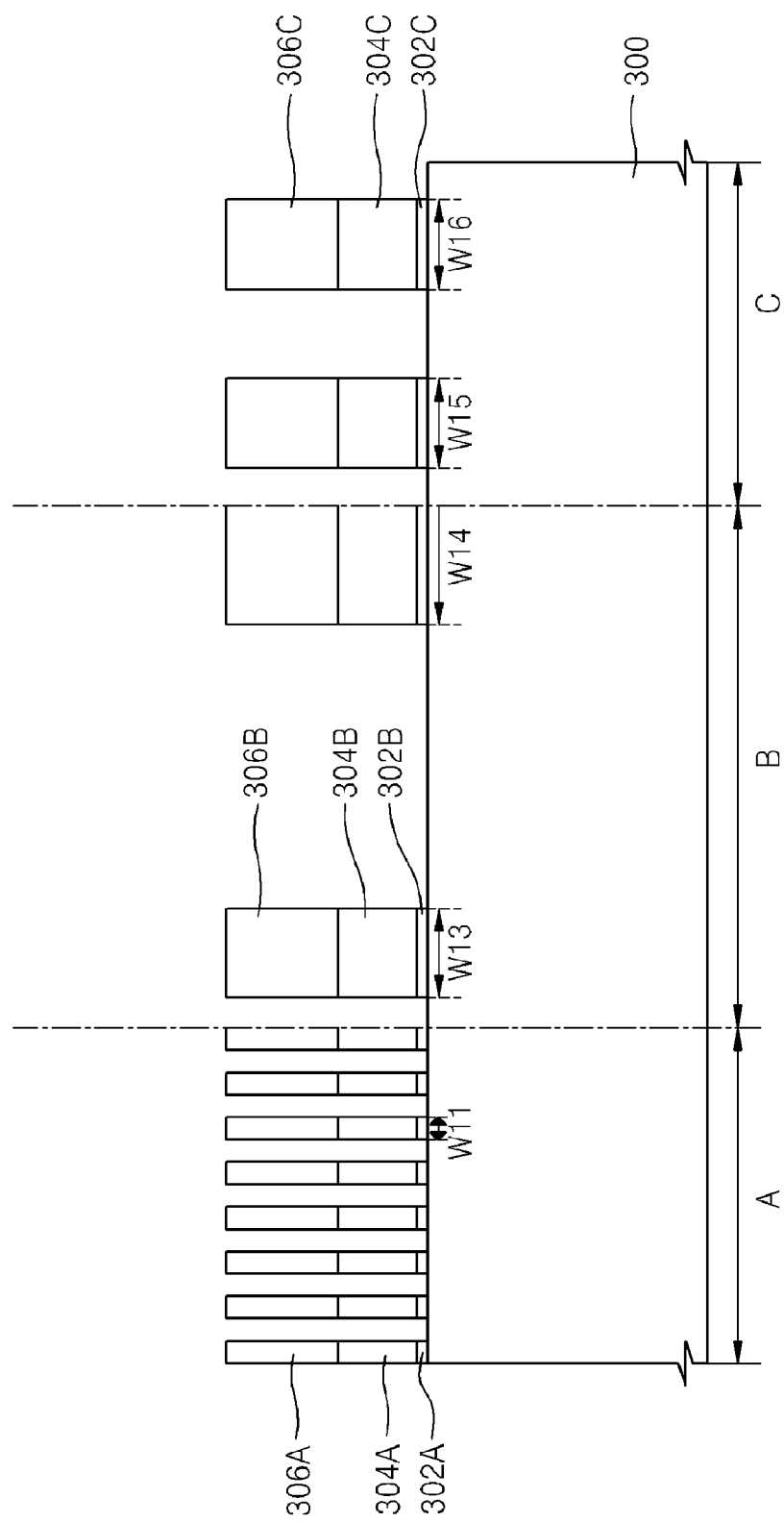

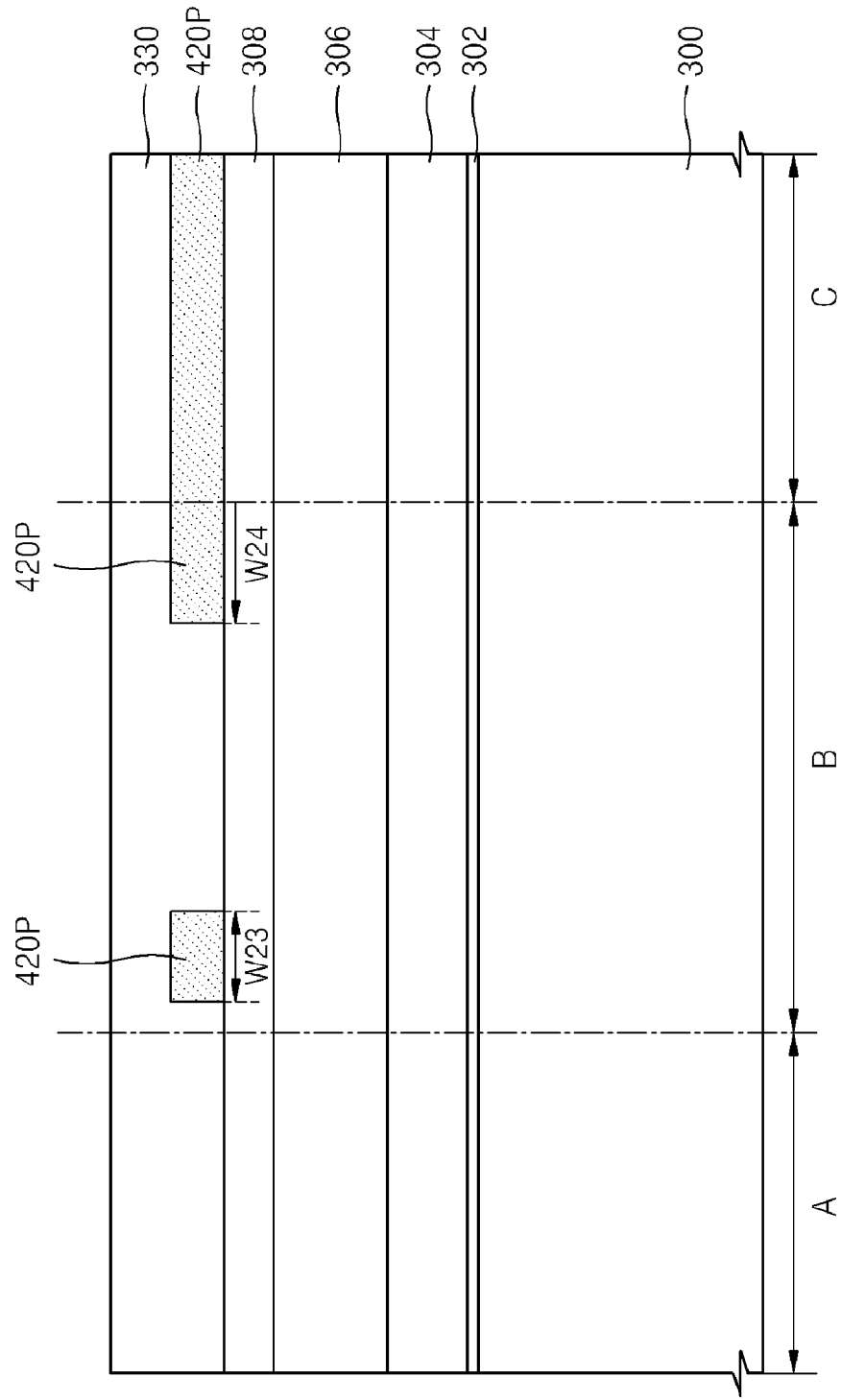

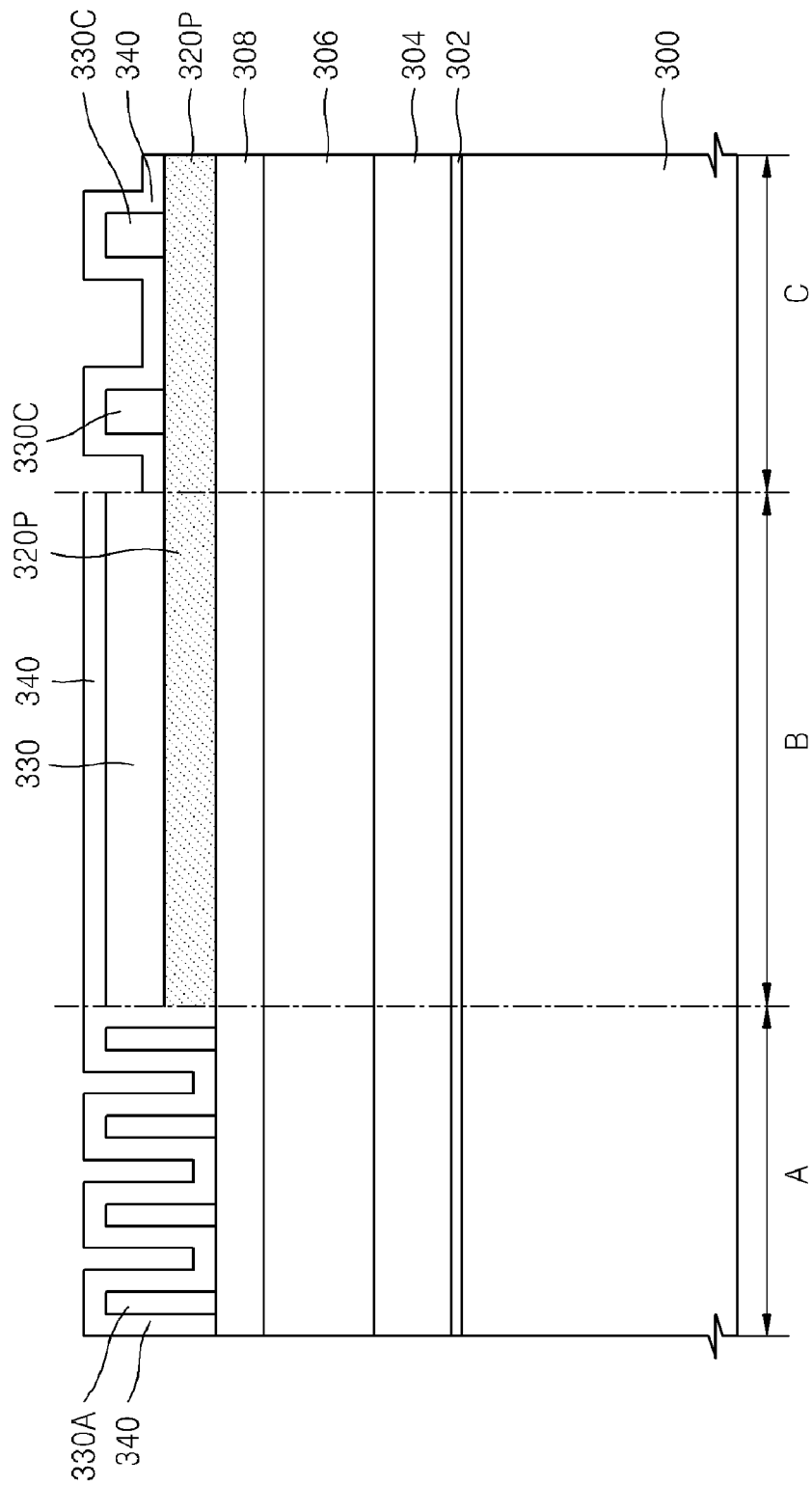

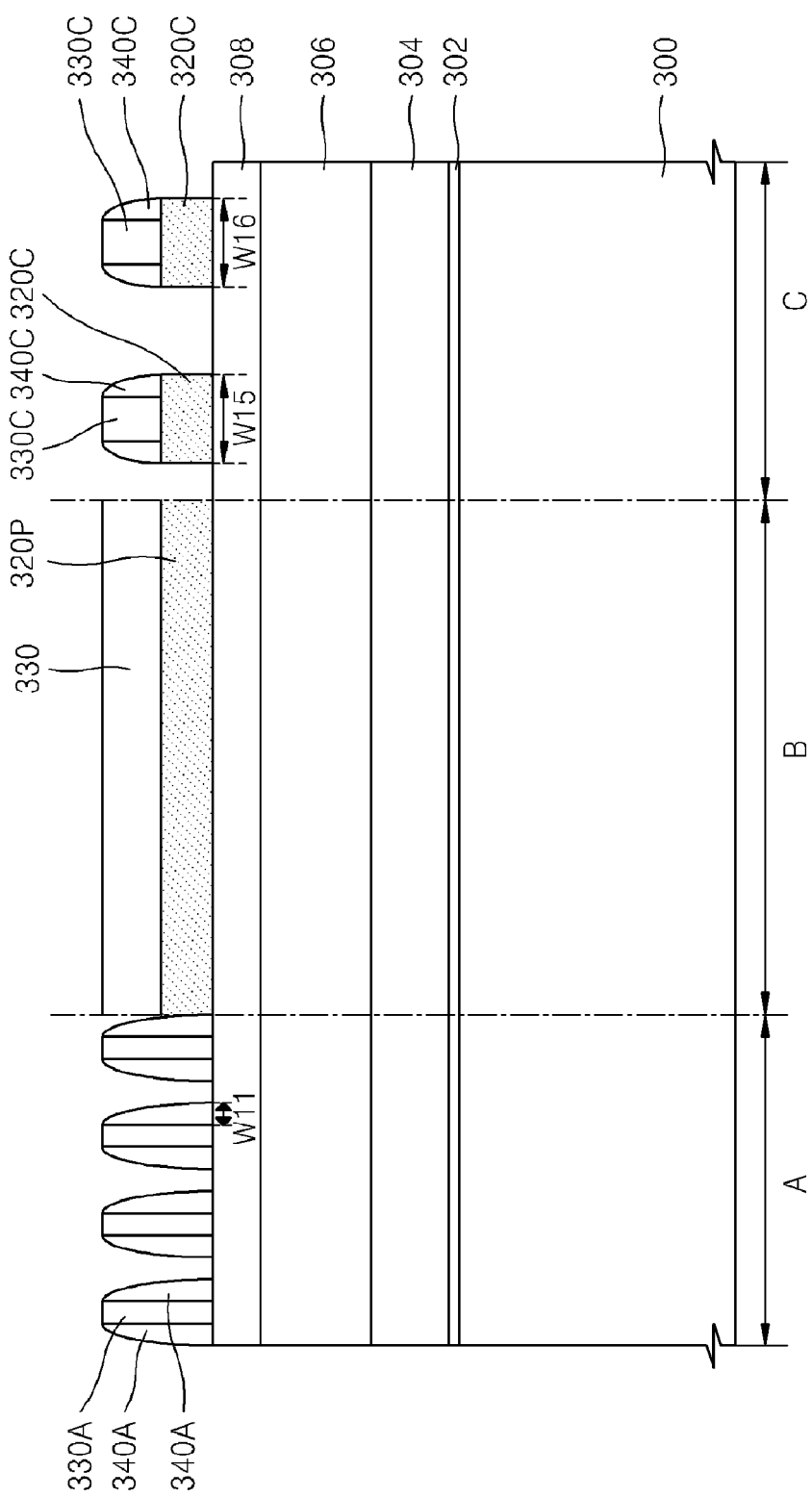

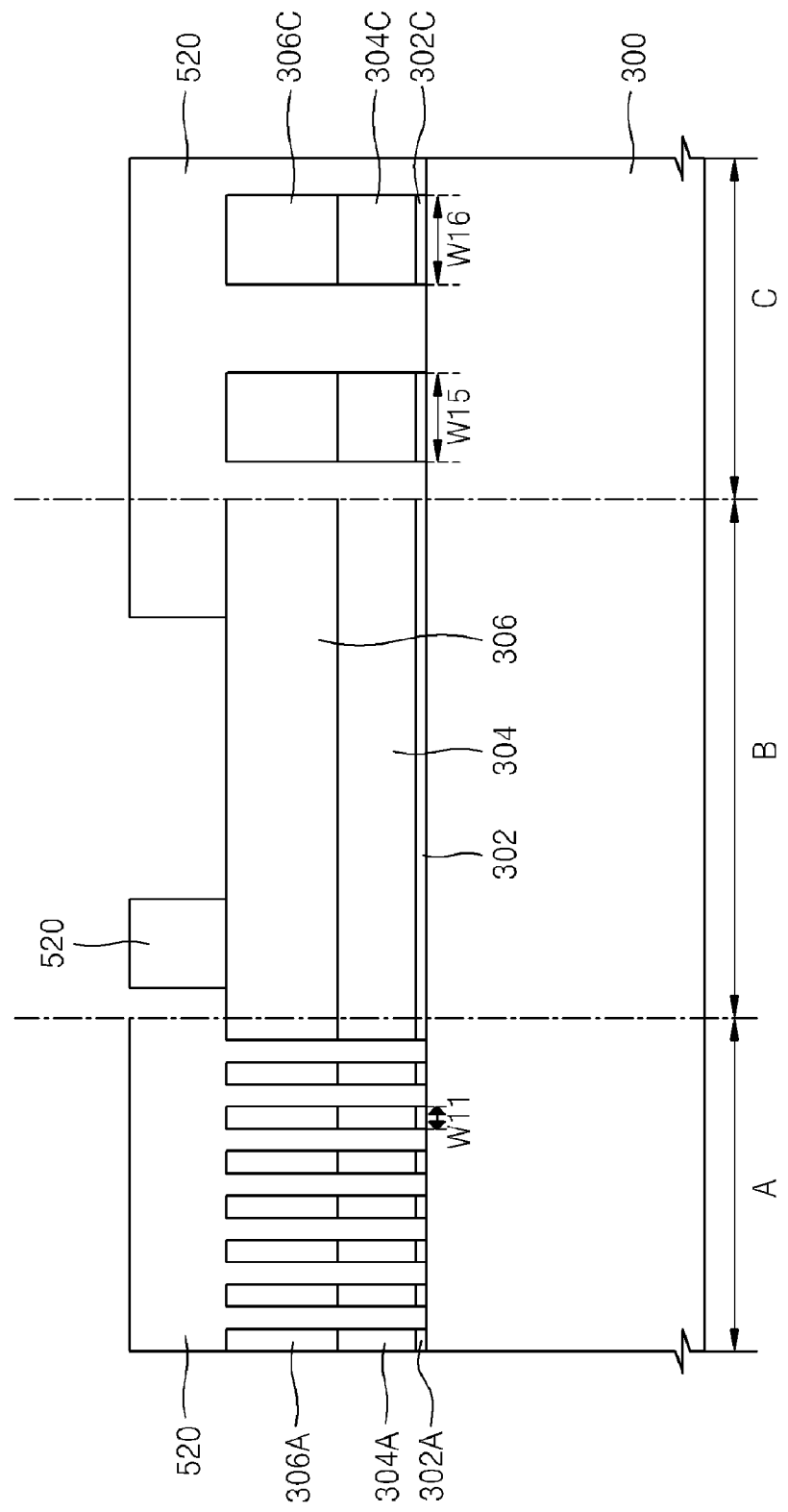

METHOD OF FORMING PATTERNS OF SEMICONDUCTOR DEVICE

BACKGROUND OF THE INVENTION

The present invention relates to the fabricating of semiconductor devices, such as LSI (large-scale integration) semiconductor devices. More particularly, the present invention relates to a method of forming patterns of a semiconductor device.

A typical semiconductor device has patterns formed on several levels on a semiconductor substrate. Photolithography is a well known process used for forming the patterns. Large-scale integration (LSI) semiconductor devices may require different patterns on the same basic level, e.g., patterns whose features have different widths. Also, some LSIs require a pattern whose features have widths so fine that the pattern can not be formed using only photolithography due to limits in the resolution of the photolithography process.

SUMMARY OF THE INVENTION

An object of the present invention is to provide a method of simultaneously forming on a semiconductor device substrate patterns whose respective topographic features have different widths.

Another object of the present invention is to provide a method of forming on a semiconductor device substrate a pattern whose respective topographic features have widths falling outside the resolution limits of photolithography (i.e., a relatively fine pattern) and on the same level a pattern whose topographic features have relatively large widths falling within the resolution limits of photolithography.

According to an aspect of the present invention, there is provided a method in the fabricating of a semiconductor device which includes forming a plurality of relatively narrow topographic features on the substrate over a first area of the device, forming a (low density) first mask pattern of at least one relatively wide topographic feature on the substrate over a second area of the device, forming first spacers on side walls of the narrow topographic features in the first area, and simultaneously transcribing in the first and second areas, respectively, the patterns of the first spacers and the relatively wide topographic feature(s) to a layer disposed under each of the first spacers and the relatively wide topographic feature(s) to thereby simultaneously form in the first and second areas respective patterns which are different in terms of the widths of their features. Preferably, the narrow topographic features are removed after the first spacers are formed and before the transcription process is carried out. The first area may correspond to a memory cell region of the device and the second area may correspond to a peripheral circuit region.

The substrate may include a semiconductor substrate and a hard mask layer disposed on the semiconductor substrate. In this case, the transcription process may be an etching process in which the hard mask layer is etched using the first spacers and the low density mask pattern as an etch mask. The etching process may also form trenches of different widths in the substrate in the first and second areas.

According to another aspect of the present invention, an alignment or overlay key is formed in a third area of the device at the same time the different patterns are formed in the first and second areas of the device. In this case, first key-fabricating topographic features are formed in the third area at the same time the topographic feature(s) is/are formed in the second area. Key-fabricating mold topographic features are formed on the first key-fabricating topographic features in the third area simultaneously as the topographic features of the mold mask pattern are formed in the first area. Spacers are formed on the side walls of the key-fabricating mold mask pattern in the third area as the first spacers are formed in the first area. The topographic features of the mold mask pattern are then removed in the first and third areas. The pattern of the first key-fabricating topographic features of the first mask pattern is then transcribed in the third area, simultaneously with the transcribing in the first and second areas, to thereby form the alignment or overlay key in the third area.

According to another aspect of the inventive concept, there is provided a method in the fabrication of a semiconductor device which includes forming a hard mask layer on a substrate, forming a mold mask pattern having a plurality of first topographic features on the hard mask layer in a first area of the device, forming a first mask pattern on the hard mask layer in a second area of the device, forming first spacers which cover the side walls of the first topographic features of the mold mask pattern in the first area, subsequently removing the first topographic features, etching the hard mask layer using the first spacers in the first area as an etch mask while removing the hard mask pattern from the hard mask layer in the second area to thereby form a plurality of first transcribed topographic features in the first area, forming an opening-fabricating mask pattern that covers the first transcribed topographic features in the first area and defines an opening in the second area, etching the substrate in the second area using the opening-fabricating mask pattern as an etch mask to thereby form a trench in the second area, removing the opening-fabricating mask pattern, and simultaneously etching the substrate in the first and second areas using the first transcribed topographic features in the first area as an etch mask to form a plurality of narrow trenches in the substrate in the first area while at the same time increasing the depth of the trench in the substrate in the second area.

BRIEF DESCRIPTION OF THE DRAWINGS

These and other objects, features and advantages of the present invention will be more clearly understood from the following detailed description of the preferred embodiments thereof as taken in conjunction with the accompanying drawings in which:

FIGS. 3A-3J are cross-sectional views of a substrate illustrating, in sequence, an embodiment of a method of forming patterns of a semiconductor device according to the present invention;

FIGS. 4A-4F are cross-sectional views of a substrate illustrating, in sequence, another embodiment of a method of forming patterns of a semiconductor device according to the present invention; and FIGS. 5A-5J are cross-sectional views of a substrate illustrating, in sequence, another embodiment of a method of forming patterns of a semiconductor device according to the present invention.

DETAILED DESCRIPTION OF THE PREFERRED EMBODIMENTS

Figure 1:
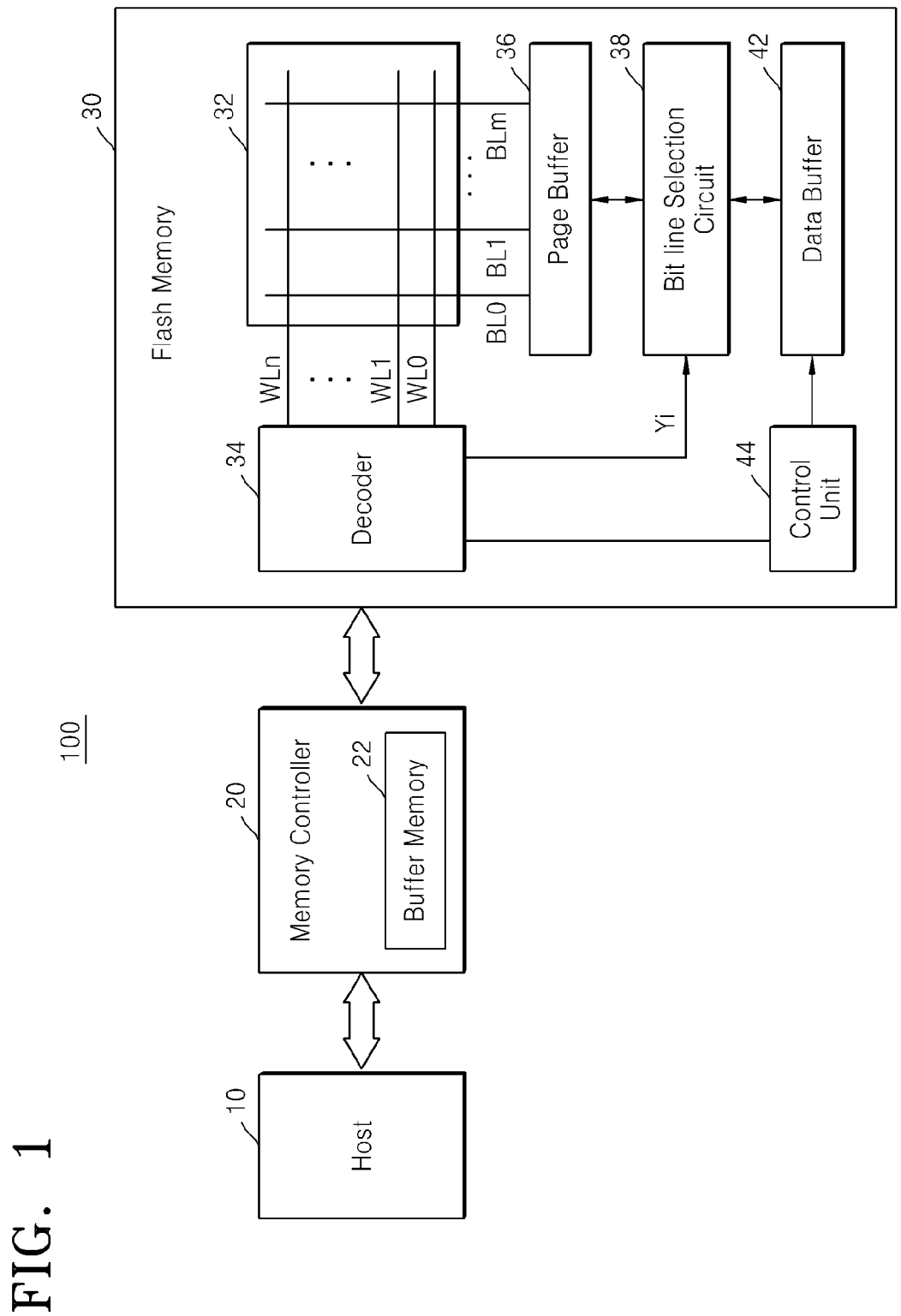
FIG. 1 is a block diagram of a memory system of an electronic device having a memory that may be fabricated using a method of forming patterns according to of the present invention.

The present invention will now be described more fully with reference to the accompanying drawings. In the drawings, the relative thicknesses of layers and regions may be exaggerated for clarity. Also, like reference numerals denote like elements throughout the drawings and thus, duplicate descriptions of such elements may be avoided at times for the sake of brevity. Also, in the specification, the term "pattern" will be used to denote one or more topographic features formed by the patterning of a layer(s) of material. In the case of a pattern formed of a series of such features, the size (e.g., width) and/or shape (e.g., linear) of the features are the same. When a pattern is described as being a narrow pattern, the term "narrow" is used to indicate that the respective width of each topographic feature(s) of the pattern is less than the width of the topographic feature(s) of another pattern, and is not used to reference the overall width of the pattern itself. Likewise, when a pattern is described as being a wide pattern, the term "wide" is used to indicate that the respective width of each topographic feature(s) of the pattern is greater than the width of a topographic feature(s) of another pattern. Furthermore, in the specification, the term pattern "density" refers to a ratio of the sum of the sectional areas of the topographic features of a pattern (taken parallel to a major surface of the substrate) to the area of the surface over which the pattern is arrayed on the substrate, i.e., the term "density" is used to connote integration density. Thus, the term "low density" may be used to describe a pattern having a relatively low degree of integration or a mask pattern which is used to form such a pattern.

Referring to FIG. 1, a memory system 100 of an electronic device includes a host 10, a memory controller 20, and a flash memory 30 as an example of a semiconductor device that can be fabricated according to the present invention.

The memory controller 20 is an interface between the host 10 and the flash memory 30 and includes a buffer memory 22. Although it is not illustrated, the memory controller 20 may further include a CPU, a ROM, a RAM, and interface blocks. The flash memory 30 includes a cell array 32, a decoder 34, a page buffer 36, a bit line selection circuit 38, a data buffer 42, and a control unit 44.

The host 10 inputs data and a write command to the memory controller 20. The memory controller 20 controls the flash memory 30 to write the data to the cell array 32 according to the input command. Also, the memory controller 20 controls the flash memory 30 to read the data stored in the cell array 32 according to a read command input by the host 10. The buffer memory 22 temporarily stores the data transmitted between the host 10 and the flash memory 30.

The cell array 32 of the flash memory 30 includes a plurality of memory cells. The decoder 34 is connected to the cell array 32 via a plurality of word lines WL0, WL1, . . . WLn. The decoder 34 receives an address input from the memory controller 20 and selects one of the word lines WL0, WL1, . . . WLn or generates a selection signal Yi to select one of a plurality of bit lines BL0, BL1, . . . BLm. The page buffer 36 is connected to the cell array 32 via the bit lines BL0, BL1, . . . BLm.

Figure 2:
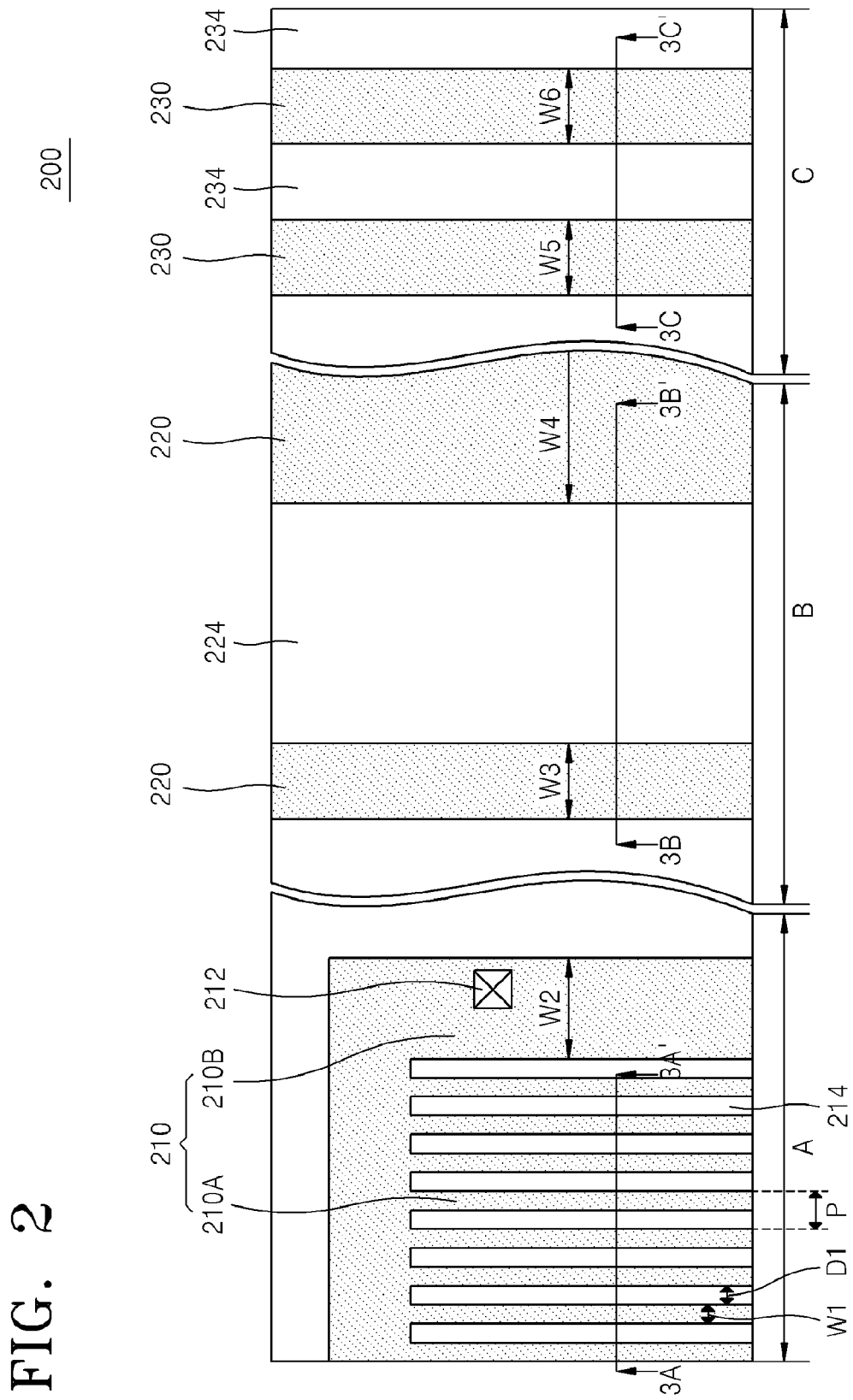
FIG. 2 is a cross section of part of a semiconductor device, showing a layout of active regions of the device, that may be fabricated using a method of forming patterns according to the present invention.

FIG. 2 illustrates the layout of part of a semiconductor device, e.g., a memory device, having patterns which can be fabricated according to the present invention. Referring to FIG. 2, a first area A of the semiconductor device may be a memory cell area including unit memory devices on a substrate (not shown). For example, the first area A may be the cell array 32 of the system shown in FIG. 1. A second area B may be a peripheral circuit area or core area including peripheral circuits for driving the unit memory devices in the first area A. A third area C may be a key area provided with an alignment key or overlay key. An alignment key is a key used to check the accuracy in the alignment of the substrate with exposure apparatus of photolithographic equipment when a pattern is to be formed (in the first or second area A or B). An overlay key is a key used to check the accuracy in the alignment between a pattern formed on one level on the substrate (in the first or second area A or B) and a pattern subsequently formed over that pattern on another (upper) level on the substrate.

The first area A has a first active region 210 that may include narrow active sub-regions 210A each having a width W1 that is a relatively small. Also, the first active region 210 may include a wide active sub-region 210B having a width W2 that is relatively large. A wiring contact 212 may be formed in the wide active sub-region 210B of the first active region 210. In the narrow active region 210A, the first active sub-regions 210 may extend parallel to each other and may be spaced from one another by an interval D1 that is relatively small. The interval D1 may be the width of a first isolation region 214 for defining the narrow active sub-regions 210A. In the first area A, the first width W1, the second width W2, and the interval D1 are designed for based on the type or desired characteristic of the semiconductor device to be formed. Therefore, the width W1 and the interval D1 may or may not be identical. For example, the width W1 and the interval D1 may be determined by a design rule established according to the size of a single memory cell that is to be formed. Each of the width W1 and the interval D1 may be designed to be 1F to 3F, where "F" indicates the minimum size (critical dimension) of a feature of a memory cell.

The second area B may have second active regions 220 having widths W3 and W4, respectively, that are different but are each greater than the width W1 of each of the narrow active sub-regions 210A of the first area A. In the second area B, the second active regions 220 may be defined by a second isolation region 224. The third area C may have third active regions 230 having widths W5 and W6, respectively, that are the same but are each greater than the width W1 of each of the narrow active sub-regions 210A of the first area A. In the third area C, the third active regions 230 may be defined by a third isolation region 234.

FIGS. 3A-3J illustrate a sequence in a method of forming patterns of a semiconductor device according to the present invention. In FIGS. 3A-3J, the first area A corresponds to the area of the memory device spanned by line 3A-3A' of FIG. 2, the second area B corresponds to the area of the memory device spanned by line 3B-3B' of FIG. 2, and the third area C corresponds to the area of the memory device spanned by line 3C-3C' of FIG. 2. Note, also, that the same technique used to form an active region 220 in the second area B may be used to form to the wide active sub-region 210B of the first area A.

Figure 3A:
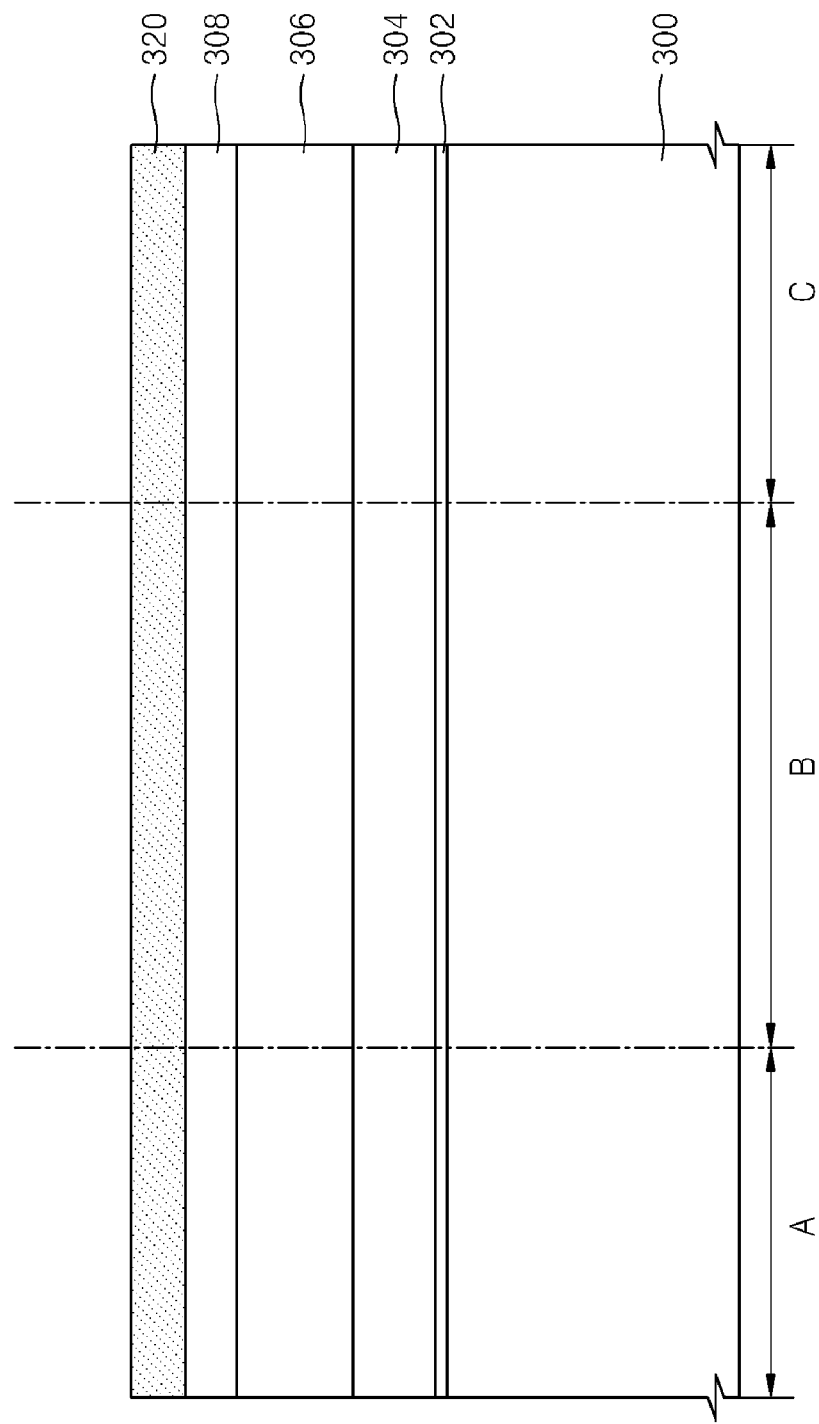

Referring first to FIG. 3A, a pad oxide film 302 is formed on a substrate 300 in the first area A, the second area B, and the third area C. The substrate 300 may be formed of a typical semiconductor substrate such as a silicon substrate. A first hard mask layer 304, a second hard mask layer 306, and a third hard mask layer 308 are sequentially formed on the pad oxide film 302. Then, a low density mask layer 320 is formed on the third hard mask layer 308.

Each of the first hard mask layer 304 and the second hard mask layer 306 may consist of a single layer. For example, the first hard mask layer 304 may be a silicon nitride film and the second hard mask layer 306 may be a silicon oxide film. Alternatively, each of the first hard mask layer 304 and the second hard mask layer 306 may be a multi-layered structure of respective lamina have different etch characteristics (different etch rates under the same etching conditions). The third hard mask layer 308 may be a polysilicon film or a silicon nitride film. In some cases, the third hard mask layer 308 may be omitted.

The low density mask layer 320 is subsequently used as an etching mask to form a pattern whose features have a larger dimension, e.g., width, than that of the narrow active sub-regions 210A. To this end, the low density mask layer 320 may have an etch selectivity with respect to the third hard mask layer 308. For example, the low density mask layer 320 is a silicon oxide film when the third hard mask layer 308 is a polysilicon film or a silicon nitride film.

Figure 3B:
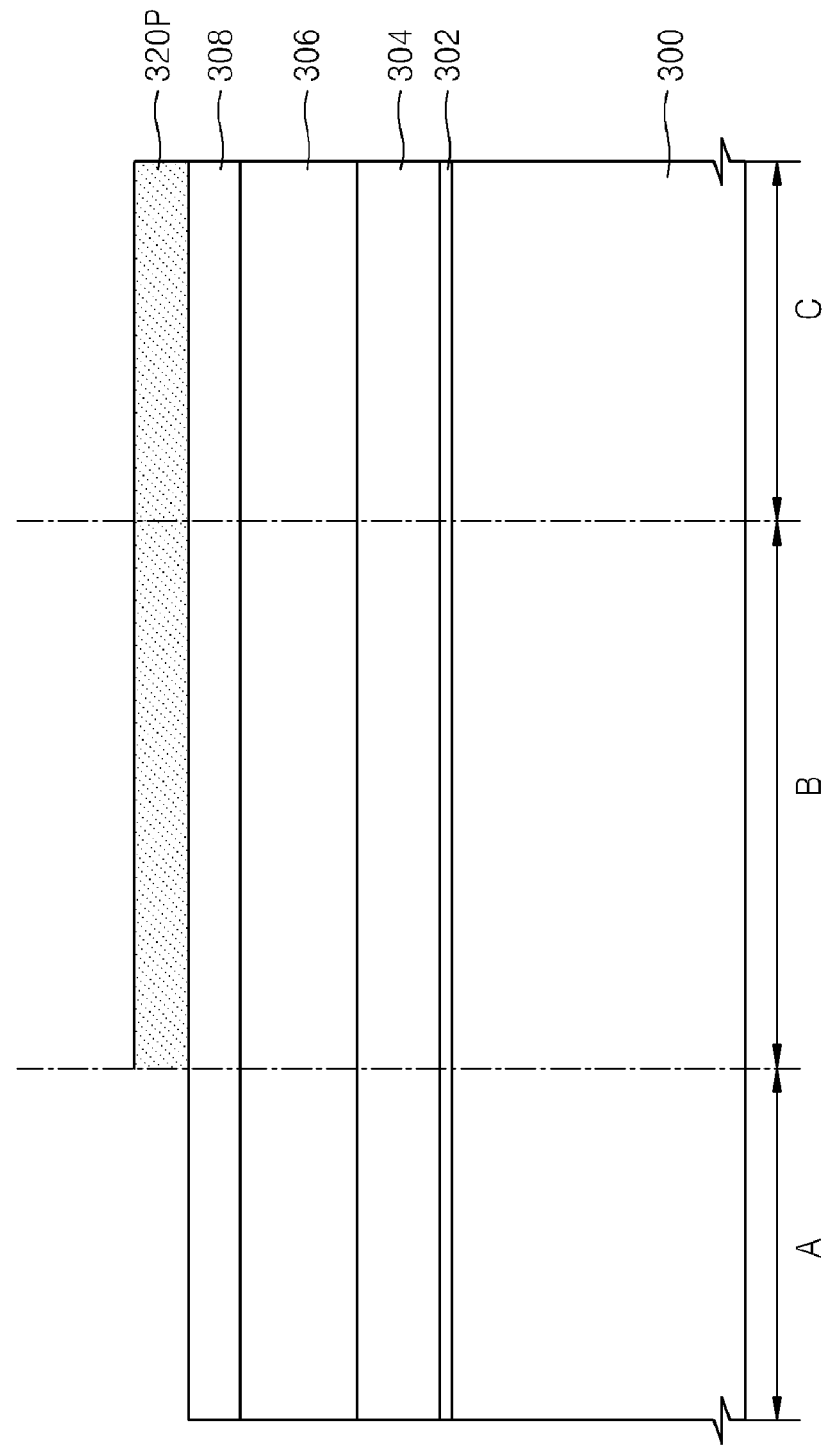

Referring to FIG. 3B, a low density mask (patterned layer) 320P that exposes the third hard mask layer 308 in the first area A is formed by removing that part of the low density mask layer 320 which extends over the first area A. The low density mask 320P, hereinafter referred to as a low density mask pattern, covers the third hard mask layer 308 in the second and third areas B and C.

Figure 3C:
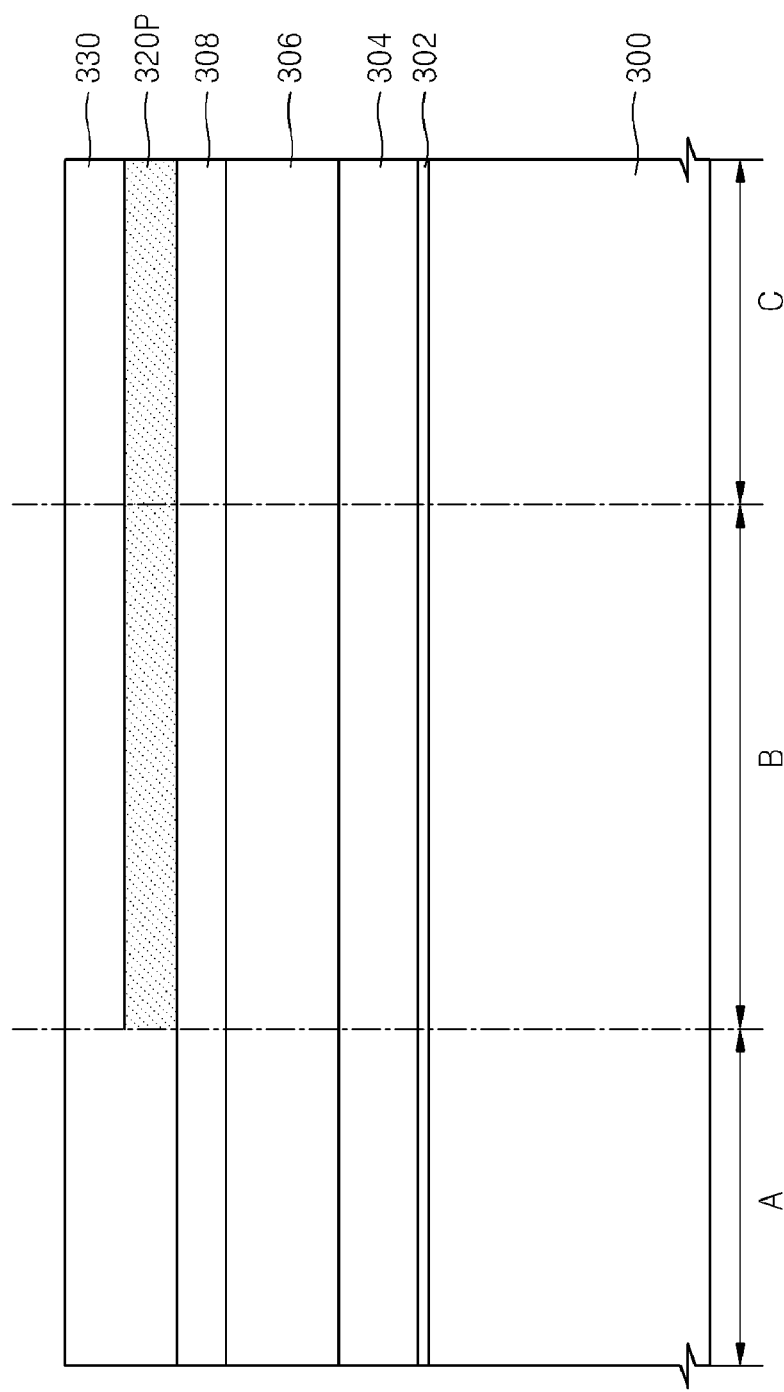

Referring to FIG. 3C, a mold mask layer 330 is formed on the third hard mask layer 308 in the first area A and on the low density mask pattern 320P in the second and third areas B and C. The mold mask layer 330 is formed of a material having an etch selectivity with respect to each of the third hard mask layer 308 and the low density mask pattern 320P. For example, the mold mask layer 330 may be a carbon based film or a polysilicon film. As a specific example, the mold mask layer 330 is a carbon based film when the third hard mask layer 308 is a polysilicon film and the low density mask pattern 320P is an oxide film. In another example, the mold mask layer 330 is a polysilicon film when the third hard mask layer 308 is a nitride film and the low density mask pattern 320P is an oxide film.

The mold mask layer 330 may be formed by a spin coating or chemical vapor deposition (CVD) process. Also, the mold mask layer 330 may be formed to have a flat upper surface throughout the first, second, and third areas A, B, and C. For example, to form the mold mask layer 330 as a carbon based film, an organic compound having a relatively high carbon content is spin coated on the third hard mask layer 308 and the low density mask pattern 320P to a thickness of about 1000-5000 Å, thereby forming an organic compound layer. The organic compound may be a hydrocarbon including an aromatic ring such as phenyl, benzene, or naphthalene, or derivatives thereof. The organic compound may have a relatively high carbon content of about 85-99 weight percent. The organic compound layer is first baked at a temperature of about 150-350° C. to produce the carbon based film. The first bake may be performed for about 60 seconds. Then, the carbon based film is baked for a second time at a temperature of about 300-550° C. to cure the film. The second bake may be performed for about 30-300 seconds. The curing of the carbon based film by the second bake process prevents the film from being adversely affected by subsequent processes such as a deposition process in which another film is formed at a relatively high temperature of about 400° C. on the carbon based film.

Figure 3D:
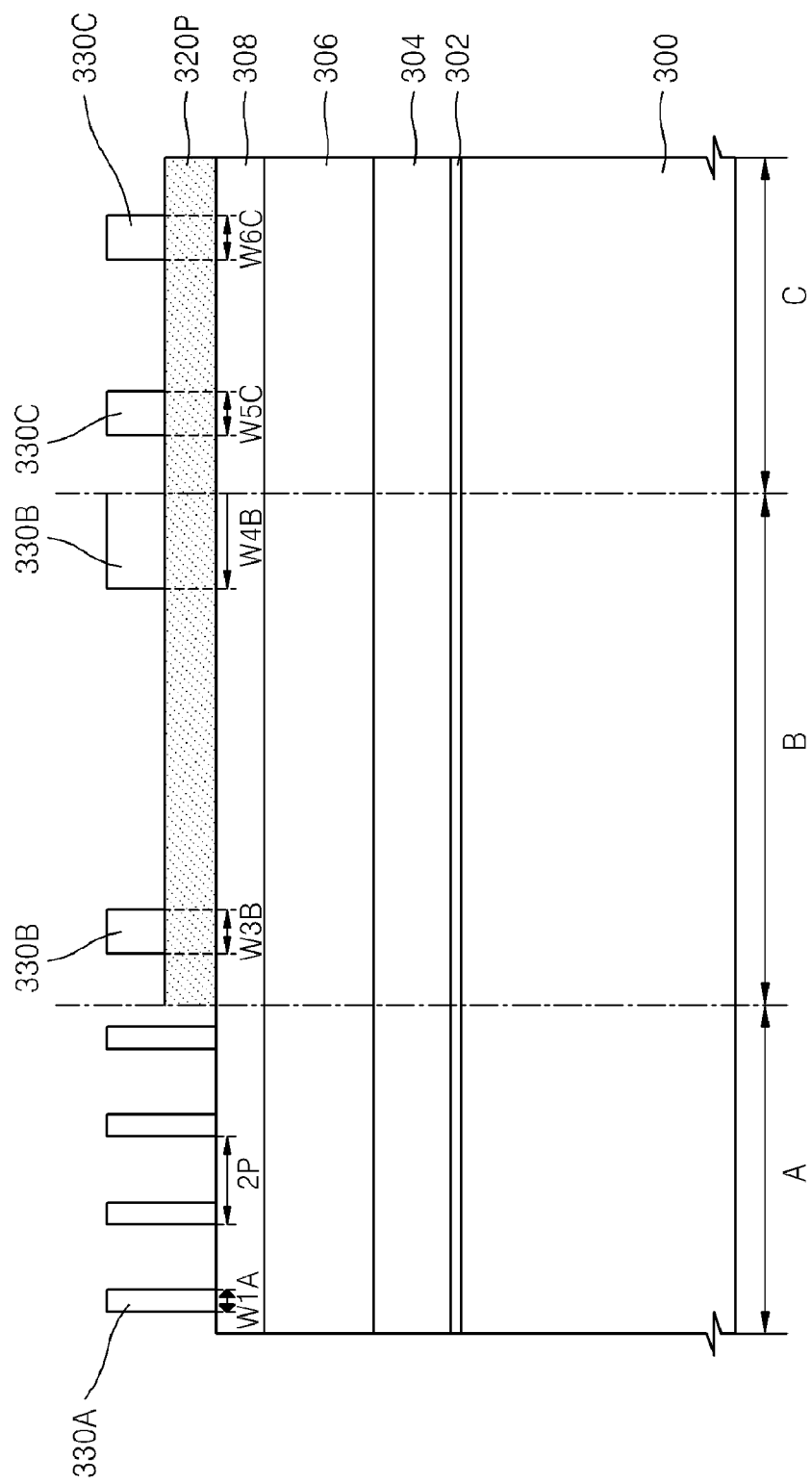

Referring to FIG. 3D, the mold mask layer 330 is patterned in the first, second, and third areas A, B, and C. To this end, a photoresist pattern (not shown) may be used as an etching mask. Accordingly, a mask is formed which includes a narrow mold mask pattern 330A on the third hard mask layer 308 in the first area A, a wide mold mask pattern 330B on the low density mask pattern 320P in the second area B, and a key generation mold mask pattern 330C on the low density mask pattern 320P in the second area B. Also, at this time, the mask may be formed to include a wide mold mask pattern (not shown) in the first area A.

In the first area A, the narrow mold mask pattern 330A has a first pitch 2P that is twice the pitch of the isolation region to be formed in the substrate 300 in the first area A, in particular, a pitch P (FIG. 2) of the first isolation region 214 interposed between the narrow active sub-regions 210A. The width W1A of each topographic feature of the narrow mold mask pattern 330A may be larger, smaller or the same as the width of isolation trenches to be formed in the substrate 300.

In the second area B, the topographic features of the wide mold mask pattern 330B each have a width W3B or W4B that is smaller than the width W3 or W4 of the second active regions 220 (FIG. 2) to be formed in the substrate 300. In the third area C, each of the topographic features of the key generation mold mask pattern 330C has a width W5C or W6C that is smaller than the width W5 or W6 of the third active regions 230 of FIG. 2 to be formed in the substrate.

Figure 3E:
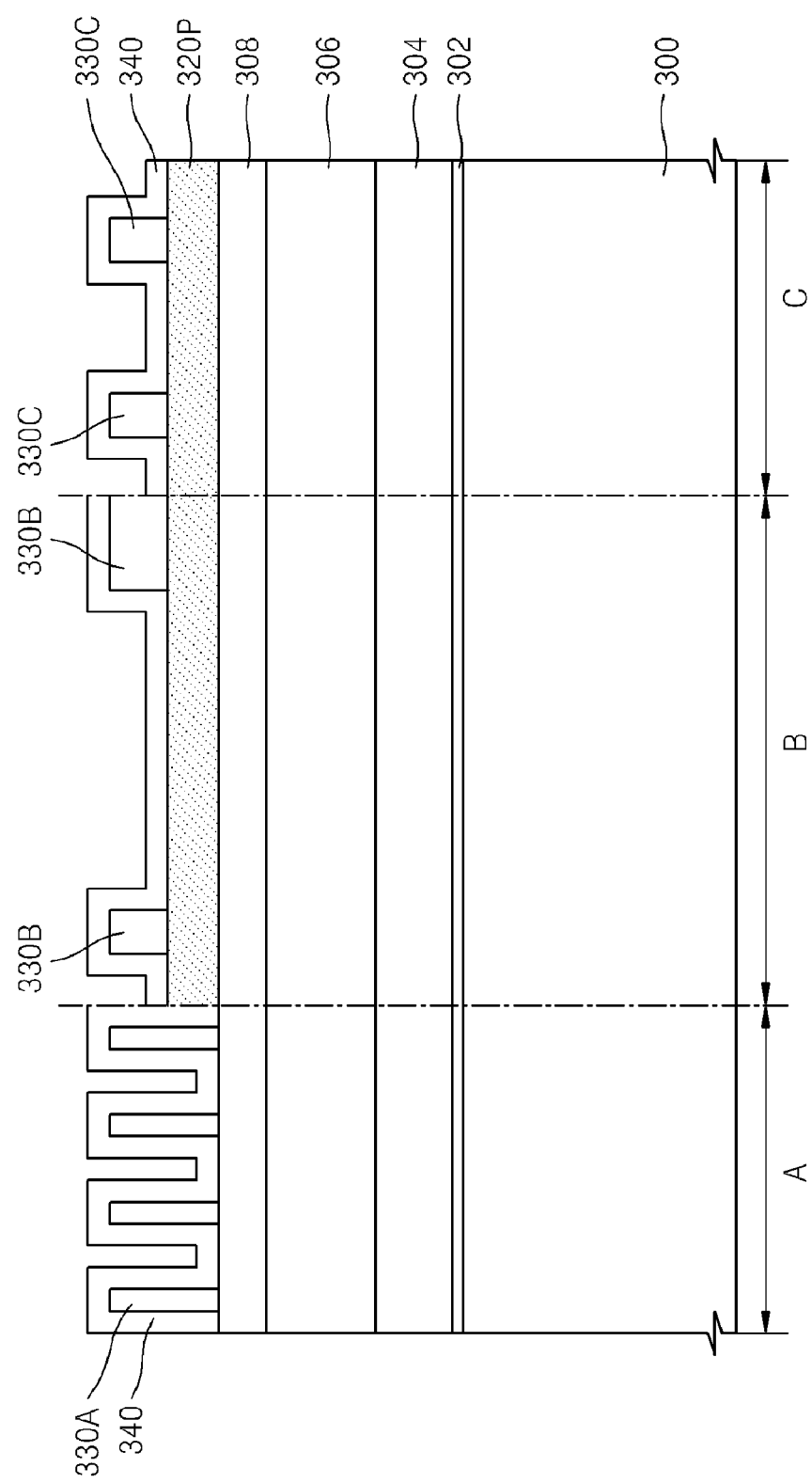

Referring to FIG. 3E, a spacer mask layer 340 is formed in the first, second, and third areas A, B, and C to cover the upper surfaces and side walls of each of the topographic features which make up the narrow mold mask pattern 330A, the wide mold mask pattern 330B, and the key generation mold mask pattern 330C, with a uniform thickness. At the same time, the upper surfaces of the third hard mask layer 308 and the low density mask pattern 320P exposed by the narrow mold mask pattern 330A, the wide mold mask pattern 330B, and the key generation mold mask pattern 330C are covered. The spacer mask layer 340 may be formed of a material having an etch characteristic which is the same as or similar (hereinafter merely referred to as "substantially the same") as that of the low density mask pattern 320P. For example, the spacer mask layer 340 may be an oxide film. An atomic layer deposition (ALD) process is used to form the spacer mask layer 340 with a uniform thickness.

Figure 3F:
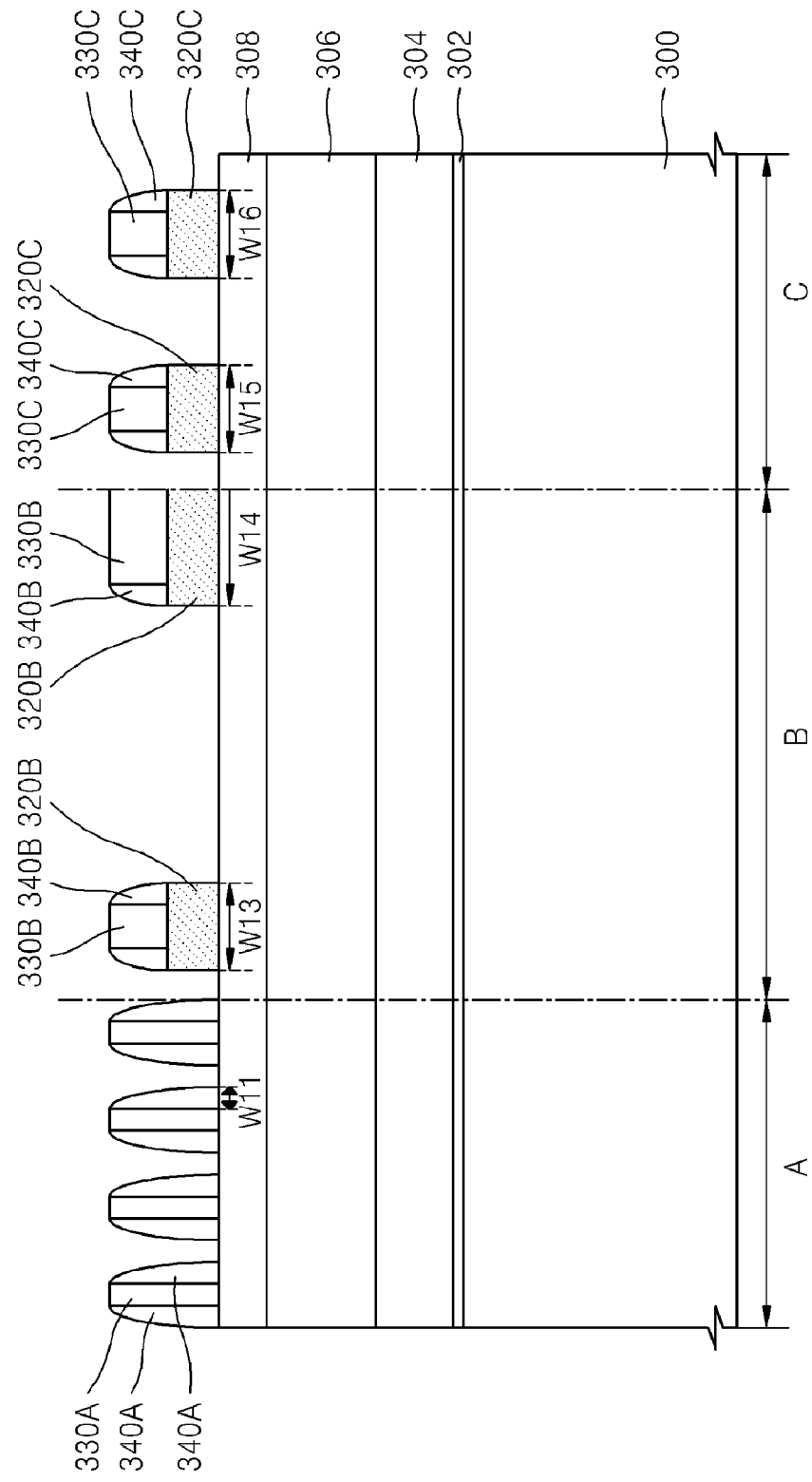

Referring to FIG. 3F, the spacer mask layer 340 is etched back to form a plurality of spacers 340A, 340B, and 340C on the substrate 300. The spacers 340A, 340B, and 340C are, respectively, a plurality of first spacers 340A formed on the second hard mask layer 308 to cover the side walls of each of the topographic features of the narrow mold mask pattern 330A in the first area A, a plurality of second spacers 340B formed on the low density mask pattern 320P to cover the side walls of each of the topographic features of the wide mold mask pattern 330B in the second area B, and a plurality of third spacers 340C formed on the low density mask pattern 320P to cover the side walls of each of the topographic features of the key generation mold mask pattern 330C in the third area C.

Once the second and third spacers 340B and 340C are respectively formed in the second and third areas B and C, portions of the low density mask pattern 320P located laterally outwardly of respective sets of the second spacers 340B and laterally outwardly of respective sets of the third spacers 340C are exposed. The low density mask pattern 320P is of material that is substantially the same as that of the spacer mask layer 340. Thus, once the low density mask pattern 320P has been exposed in the second and third areas B and C, the spacer mask layer 340 continues to be etched back until the third hard mask layer 308 is exposed in the first area A. While the first spacers 340A are formed, the low density mask pattern 320P is etched back in the second and third areas B and C until the third hard mask layer 308 under the low density mask pattern 320P is exposed in the second and third areas B and C.

As a result, a low density mask pattern 320B is formed in the second area B. Each topographic feature of the low density mask pattern 320B has a width W13 or W14 corresponding to the sum of the width of a topographic feature of a wide mold mask pattern 330B and the widths of the second spacers 340B covering the side walls of the topographic feature of the wide mold mask pattern 330B. The widths W13 and W14 may correspond to the widths W3 and W4 of the second active regions 220 (FIG. 2), respectively. In the third area C, a low density mask pattern 320C is formed. Each topographic feature of the low density mask pattern 320C has a width W15 or W16 corresponding to the sum of the width of a topographic feature of the key generation mold mask pattern 330C and the widths of the third spacers 340C covering both side walls of the topographic feature of the key generation mold mask pattern 330C. The widths W15 and W16 may correspond to the widths W5 and W6 of the third active regions 230 (FIG. 2). Each first spacer 340A formed on the first area A may have a width W11 corresponding to the width W1 of a narrow active sub-region 210A.

Figure 3G:
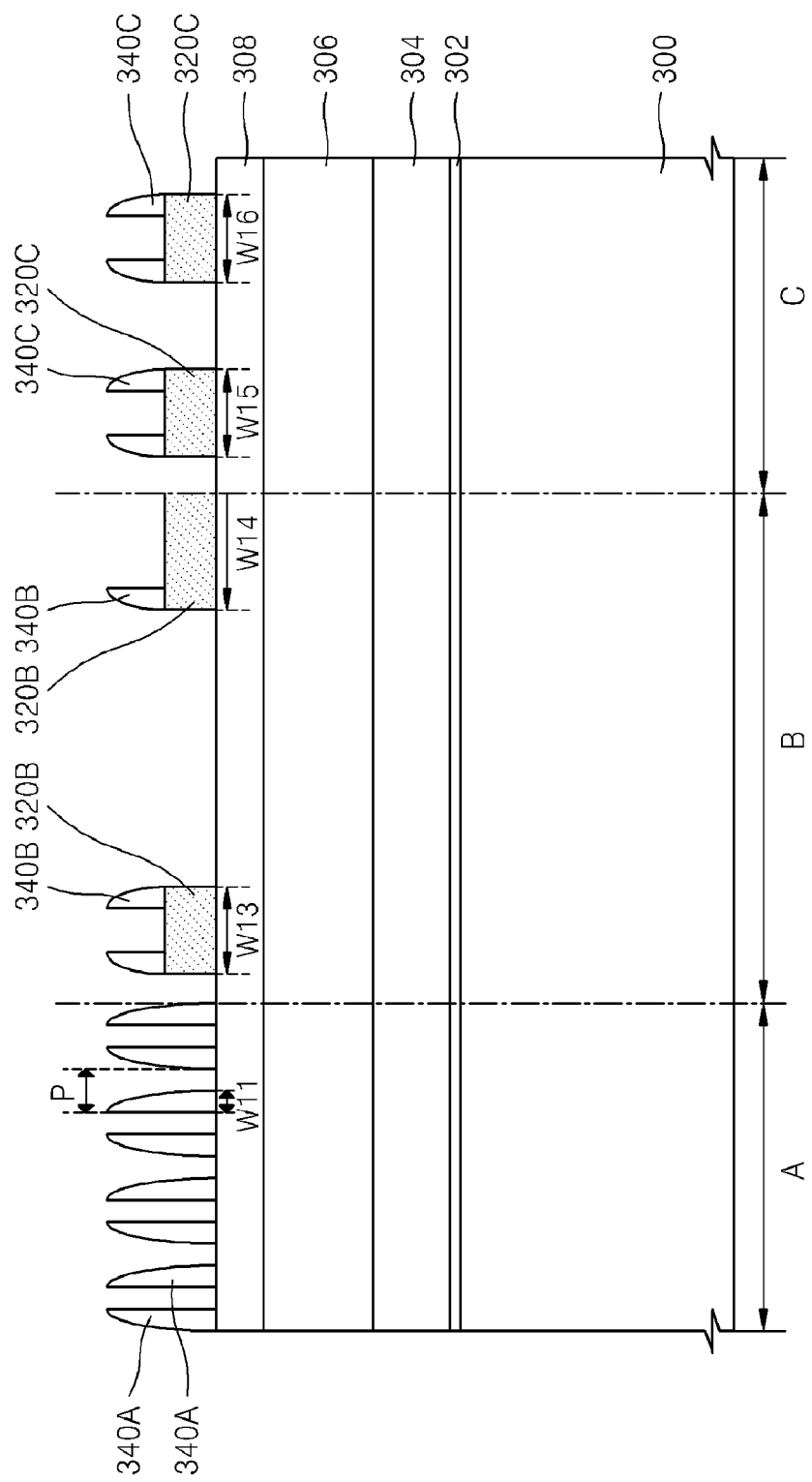

Referring to FIG. 3G, the narrow mold mask pattern 330A, the wide mold mask pattern 330B, and the key generation mold mask pattern 330C are respectively removed (etched) from the first, second, and third areas A, B, and C without the spacers 340A, 340B, and 340C, the third hard mask layer 308, and the low density mask patterns 320B and 320C being removed (etched). As a result, in the first area A, only the first spacers 340A are left on the third hard mask layer 308. In the second area B, the low density mask pattern 320B and the second spacers 340B formed thereon are left on the third hard mask layer 308. In the third area C, the low density mask pattern 320C and the third spacers 340C formed thereon are left on the third hard mask layer 308. In the first area A, the first spacers 340A, having a fine pitch P that is ½ of the first pitch 2P (FIG. 3D) are left on the third hard mask layer 308.

Referring to FIG. 3H, the third hard mask layer 308 is etched using the first spacers 340A in the first area A, the low density mask pattern 320B in the second area B, and the low density mask pattern 320C in the third area C, as etch masks. Thus, a plurality of third hard mask patterns 308A, 308B, and 308C, exposing the second hard mask layer 306, are respectively formed in the first, second, and third areas A, B, and C. Although it is not shown in FIG. 3H, the first spacers 340A, the second spacers 340B, the third spacers 340C, and the low density mask patterns 320B and 320C may remain on the upper surfaces of the third hard mask patterns 308A, 308B, and 308C.

Referring to FIG. 3I, the second hard mask layer 306, the first hard mask layer 304, and the pad oxide film 302 are etched using the third hard mask patterns 308A, 308B, and 308C as etch masks, respectively, in the first, second, and third areas A, B, and C. Thus, second hard mask patterns 306A, 306B, and 306C, first hard mask patterns 304A, 304B, and 304C, and pad oxide film patterns 302A, 302B, and 302C, exposing the substrate 300, are formed. Although it is not shown in FIG. 3I, the third hard mask patterns 308A, 308B, and 308C may remain on the upper surfaces of the second hard mask patterns 306A, 306B, and 306C.

Figure 3J:
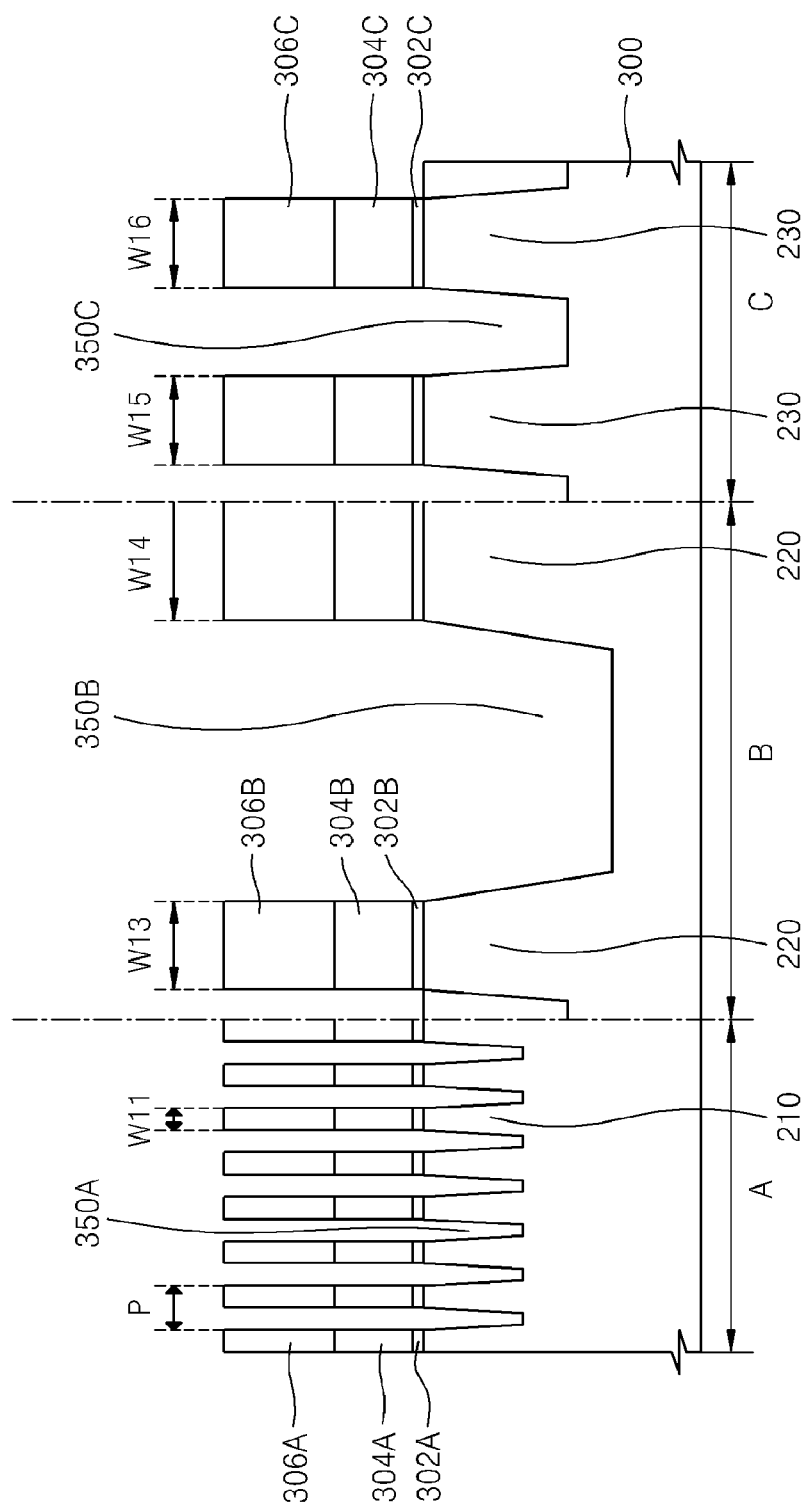

Referring to FIG. 3J, the substrate 300 is etched using the second hard mask patterns 306A, 306B, and 306C and the first hard mask patterns 304A, 304B, and 304C as etch masks, in the first, second, and third areas A, B, and C. Thus, first trenches 350A, second trenches 350B, and third trenches 350C are simultaneously formed in the first, second, and third areas A, B, and C, respectively. The first trenches 350A, the second trenches 350B, and the third trenches 350C may each have a depth corresponding to the width thereof, that is, the width in a direction parallel to a major surface of the substrate 300. Thus, the depth of the first trenches 350A may be different from the depth of the second trenches 350B and the depth of the third trenches 350C. In the first area A, the first trenches 350A may be spaced from one another at a fine pitch P that is ½ of the first pitch 2P (FIG. 3D).

Predetermined amounts (thicknesses) of the second hard mask patterns 306A, 306B, and 306C may be consumed during the forming of the first, second, and third trenches 350A, 350B, and 350C in the first, second, and third areas A, B, and C. Then, each of the first, second, and third trenches 350A, 350B, and 350C may be filled with insulation material to form an isolation layer (not shown) for defining the first, second, and third active regions 210, 220, and 230. The portions of the isolation layer formed in each of the first, second, and third trenches 350A, 350B, and 350C constitute the first, second, and third isolation regions 214, 224, and 234 (FIG. 2), respectively. In particular, the portion of the isolation layer formed in the third trenches 350C in the third area C, that is, in the isolation region 234 (FIG. 2), and the third active region 230 may constitute an alignment key or overlay key by which the accuracy of the alignment of a pattern or the overlay of patterns in the cell array area or in the peripheral circuit area can be checked.

FIGS. 4A-4F illustrate another embodiment of a method of forming patterns of a semiconductor device according to the present invention. Similarly to the embodiment of FIGS. 3A-3J, the method of the present embodiment may be used to define the layout of active regions shown in FIG. 2.

Figure 4A:
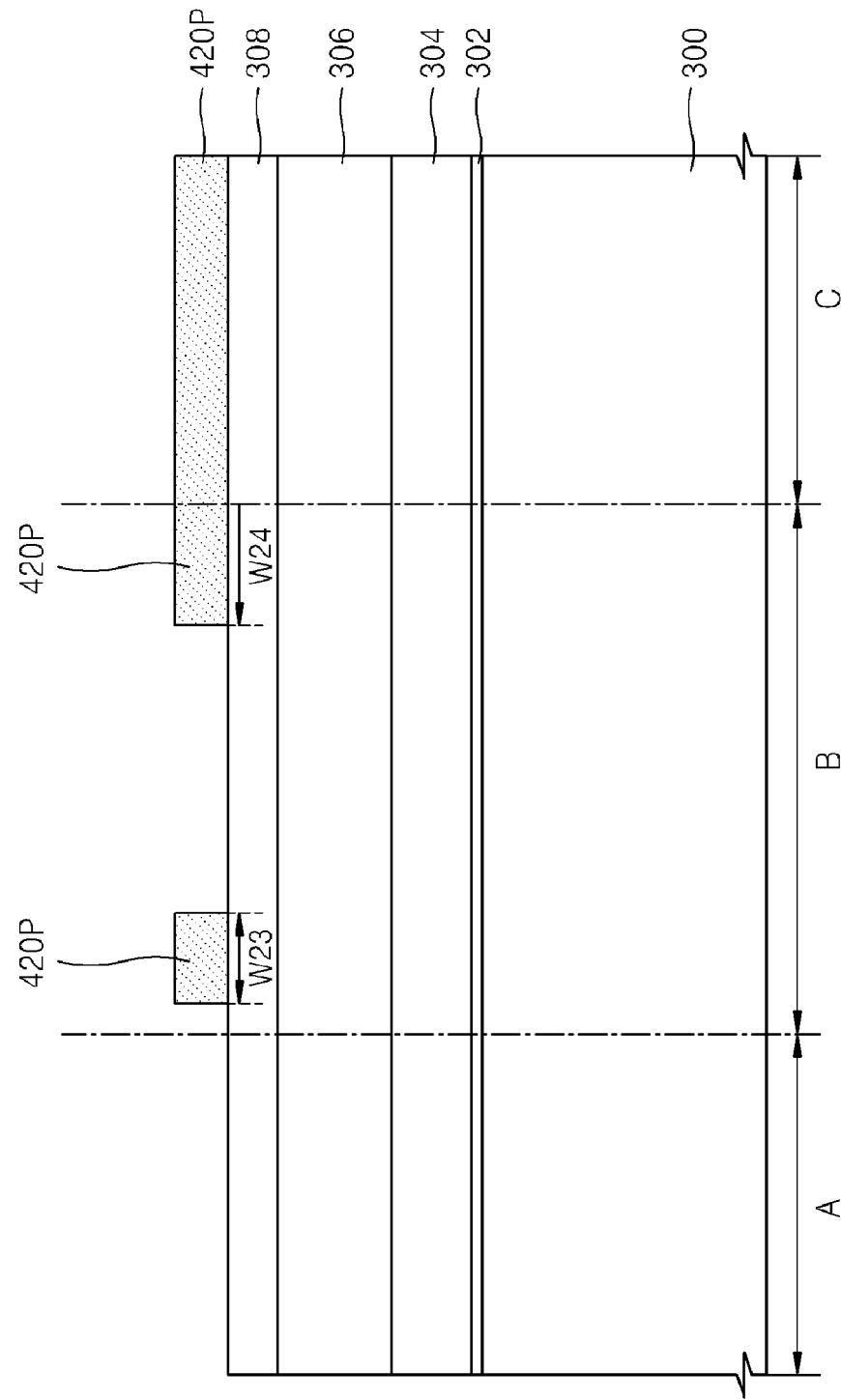

Referring to FIG. 4A, in a process similar to that described with reference to FIG. 3A, a pad oxide film 302, a first hard mask layer 304, a second hard mask layer 306, and a third hard mask layer 308 are sequentially formed on first, second, and third areas A, B, and C of a substrate 300. The low density mask layer 320 is formed on the third hard mask layer 308. Then, that part of the low density mask layer 320 which covers the first area A of the substrate 300 is removed. As a result, a low density mask pattern 420P which exposes the third hard mask layer 308 is formed in the first area A.

This embodiment differs, though, from the embodiment described above with reference to FIGS. 3A-3J, in that part of the low density mask layer 320 in the second area B is removed such that the low density mask pattern 420P also exposes part of the upper surface of the third mask layer 308 in the second area B. In the second area B, the widths W23 and W24 of topographic features of the low density mask pattern 420P may respectively correspond to the widths W3 and W4 of the second active region 220 (FIG. 2). On the other hand, in the third area C, as in the process described above with reference to FIG. 3B, the third hard mask layer 308 is covered by the low density mask pattern 420P.

Referring to FIG. 4B, in a process similar to that described with reference to FIG. 3C, a mold mask layer 330 is formed on the third hard mask layer 308 in the first area A, the third hard mask layer 308 and the low density mask pattern 420P in the second area B, and the low density mask pattern 420P in the third area C.

Figure 4C:
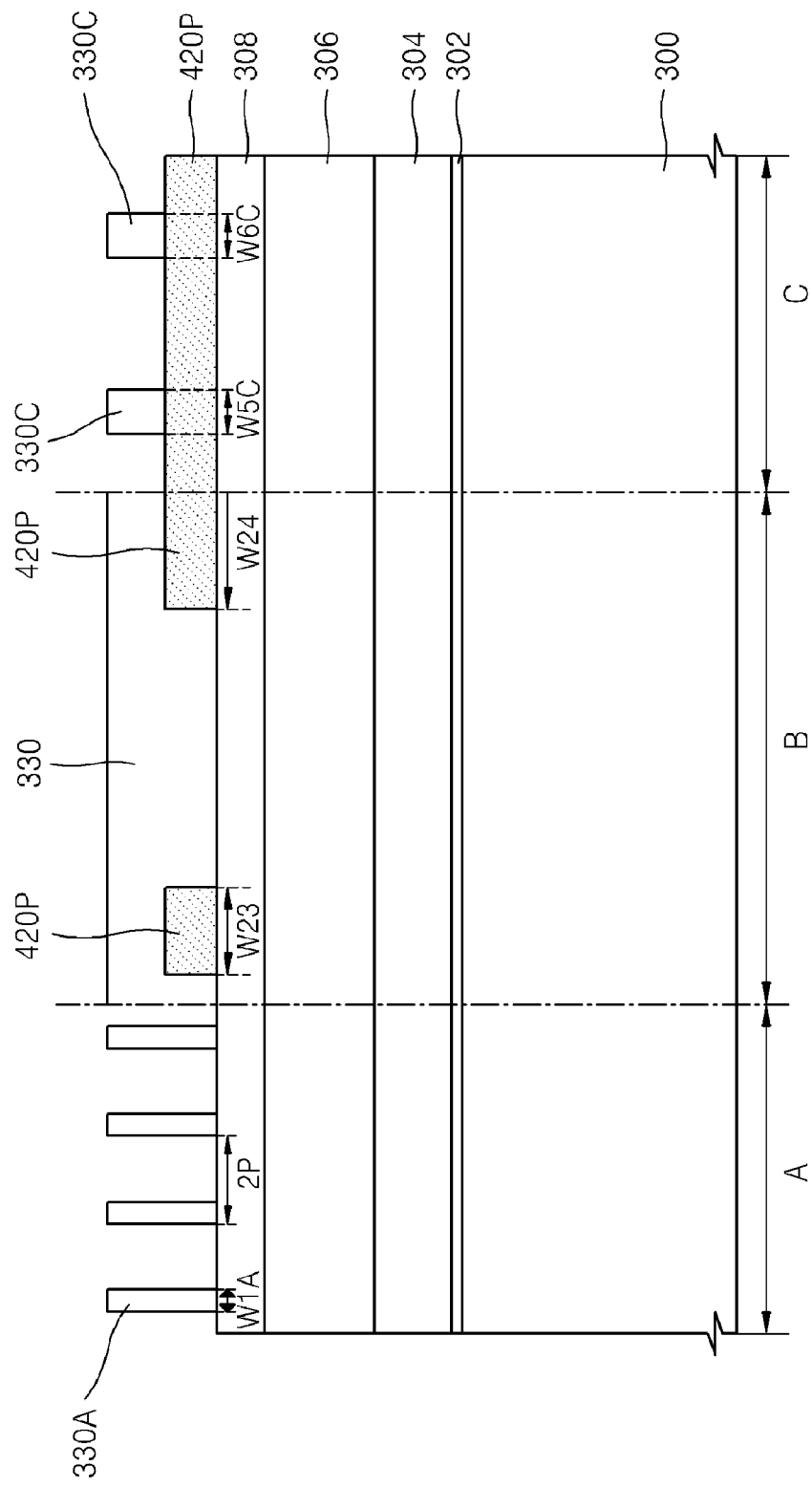

Referring to FIG. 4C, the mold mask layer 330 is patterned by a process similar to that described with reference to FIG. 3D. In the present embodiment, however, the mold mask layer 330 is removed only from the first and third areas A and C whereas the portion of the mold mask layer 330 formed in the second area B is left unchanged. Thus, a narrow mold mask pattern 330A is formed on the third hard mask layer 308 in the first area A and a key generation mold mask pattern 330C is formed on the low density mask pattern 420P in the third area C.

Figure 4D:
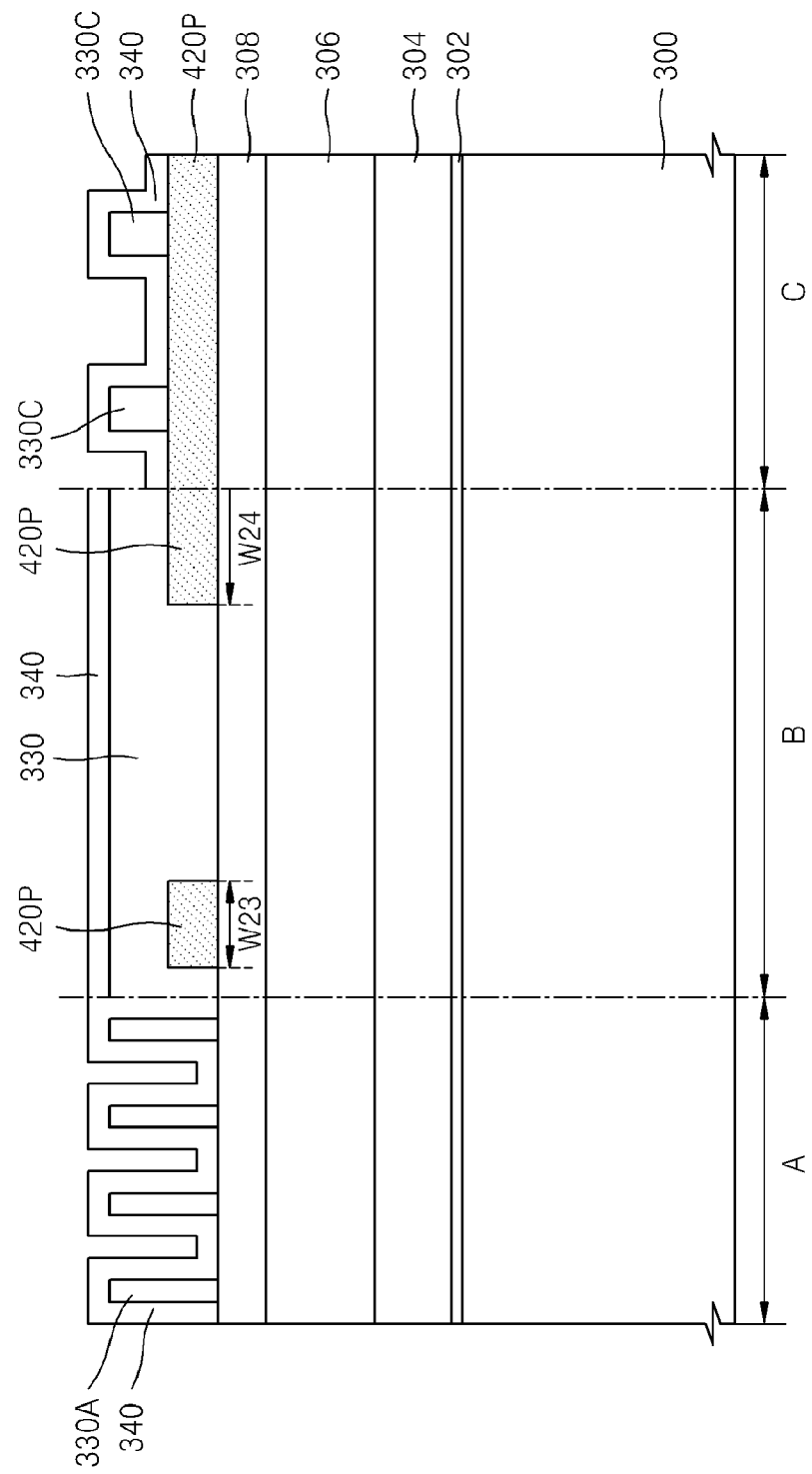

Referring to FIG. 4D, a spacer mask layer 340 is formed in the first, second, and third areas A, B, and C as described with reference to FIG. 3E. The spacer mask layer 340 covers, with a uniform thickness, the upper surfaces and the side walls of each of the topographic features which make up the narrow mold mask pattern 330A formed in the first area A, the mold mask layer 330 formed in the second area B, and the key generation mold mask layer 330 formed in the third area C.

Figure 4E:
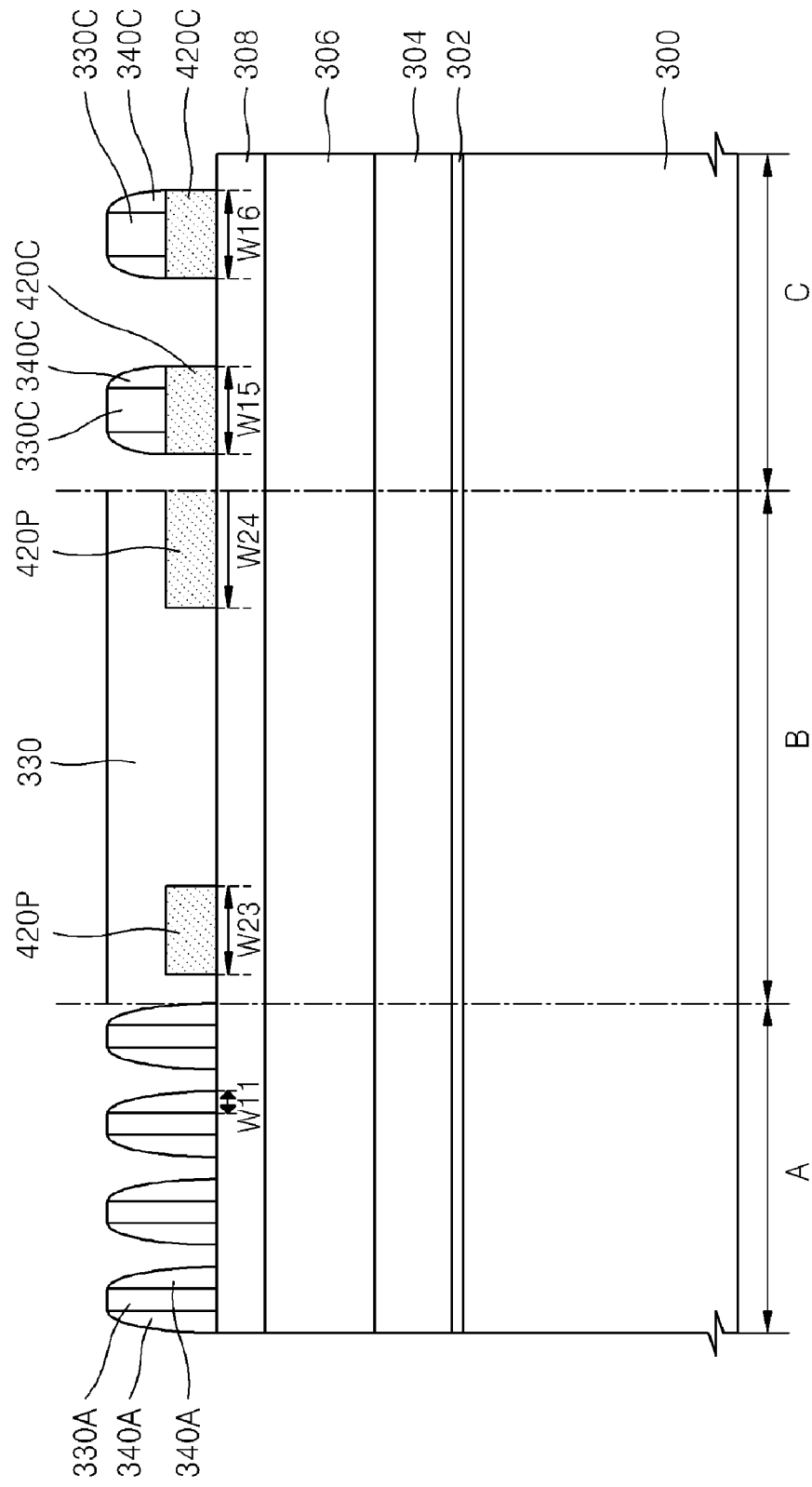

Referring to FIG. 4E, the spacer mask layer 340 is etched back using a process similar to that described with reference to FIG. 3F. As a result, first spacers 340A covering the side walls of each of the topographic features of the narrow mold mask pattern 330A are formed on the second hard mask layer 308 in the first area A. In the third area C, third spacers 340C are formed on the low density mask pattern 420P. Therefore, an intermediate product similar to that shown in FIG. 3F is formed. However, in contrast to the intermediate product similar to that shown in FIG. 3F, the mold mask layer 330 is left on the substrate 300 in the second area B.

The low density mask pattern 420P is exposed laterally outwardly of the sets of third spacers 340C. The low density mask pattern 420P is formed of material that is substantially the same as that of the spacer mask layer 340. Thus, during the etch back process, once the low density mask pattern 420P is exposed in the third area C, the spacer mask layer 340 continues to be etched back until the third hard mask layer 308 is exposed in the first area A. Once the first spacers 340A are formed, the exposed part of the low density mask pattern 420P is etched back in the third area C such that portions of the third hard mask layer 308 are exposed in the third area C.

As a result, a low density mask pattern 420C is formed in the third area C. Each topographic feature of the low density mask pattern 420C has a width W15 or W16 corresponding to the sum of the width of a topographic feature of the key generation mold mask pattern 330C and the widths of the third spacers 340C covering both side walls of the of the topographic feature key of the generation mold mask pattern 330C. The widths W15 and W16 may correspond to the widths W5 and W6 of the third active region 230 (FIG. 2).

Figure 4F:
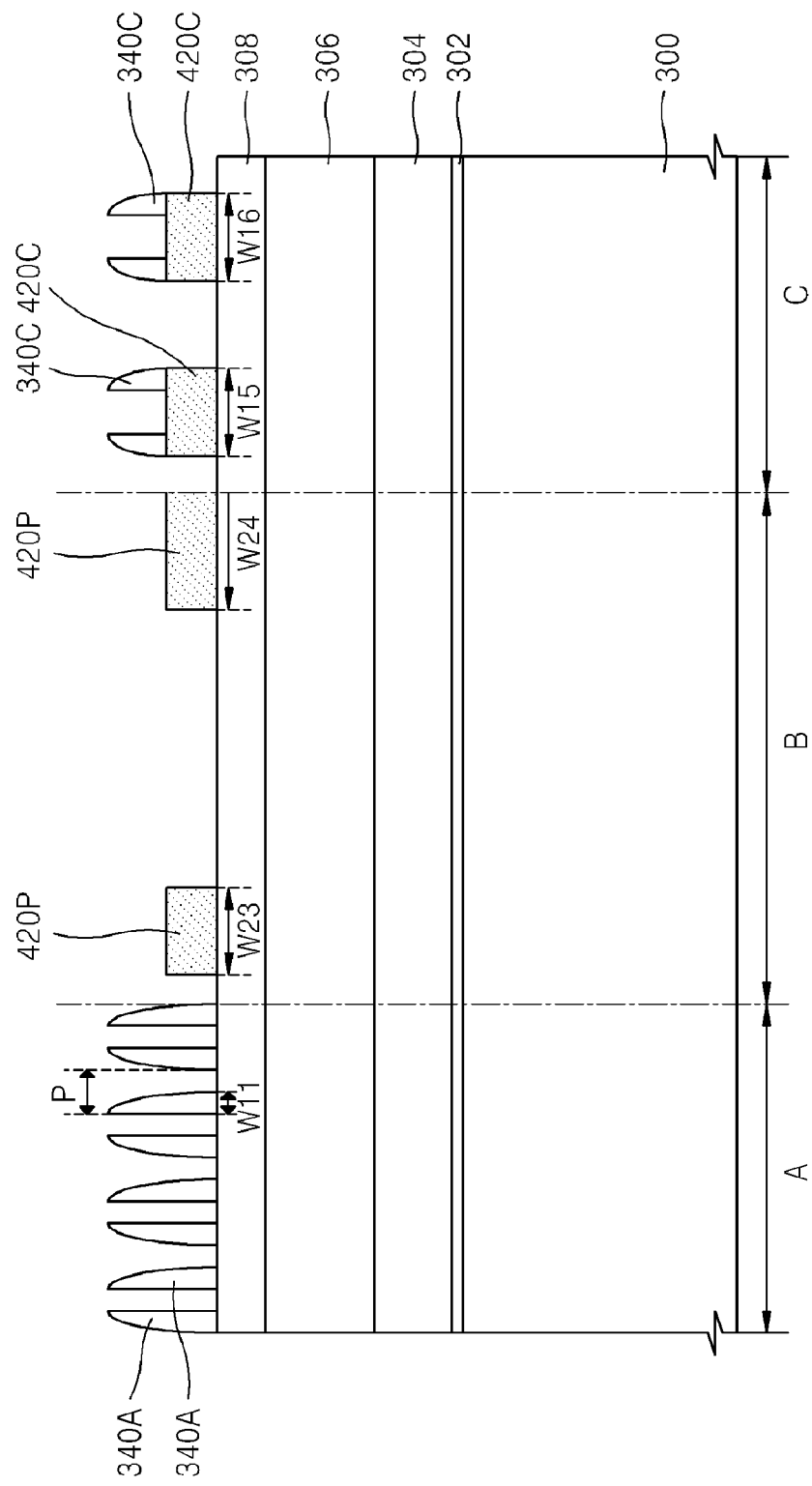

Referring to FIG. 4F, the narrow mold mask pattern 330A, the mold mask layer 330, and the key generation mold mask pattern 330C are respectively removed (etched away) from the first, second, and third areas A, B, and C in a manner similar to that described with reference to FIG. 3G. In this process, the spacers 340A and 340C, the third hard mask layer 308, and the low density mask patterns 420P are not removed (etched).

Then, the third hard mask layer 308 is etched in a manner similar to that described with reference to FIG. 3H using the first spacers 340A, the low density mask pattern 420P, and the low density mask pattern 420C as etch masks, respectively, in the first, second, and third areas A, B, and C. As a result, third hard mask patterns 308A, 308B, and 308C (similar to those shown in FIG. 3H), which expose the second hard mask layer 306 in the first, second, and third areas A, B, and C, are formed. Subsequently, processes corresponding to the processes described with reference to FIGS. 3I and 3J are performed.

FIGS. 5A-5J illustrate still another embodiment of a method of forming patterns of a semiconductor device according to the present invention. The method of the present embodiment may be used to form the layout of active regions shown in FIG. 2.

Figure 5A:
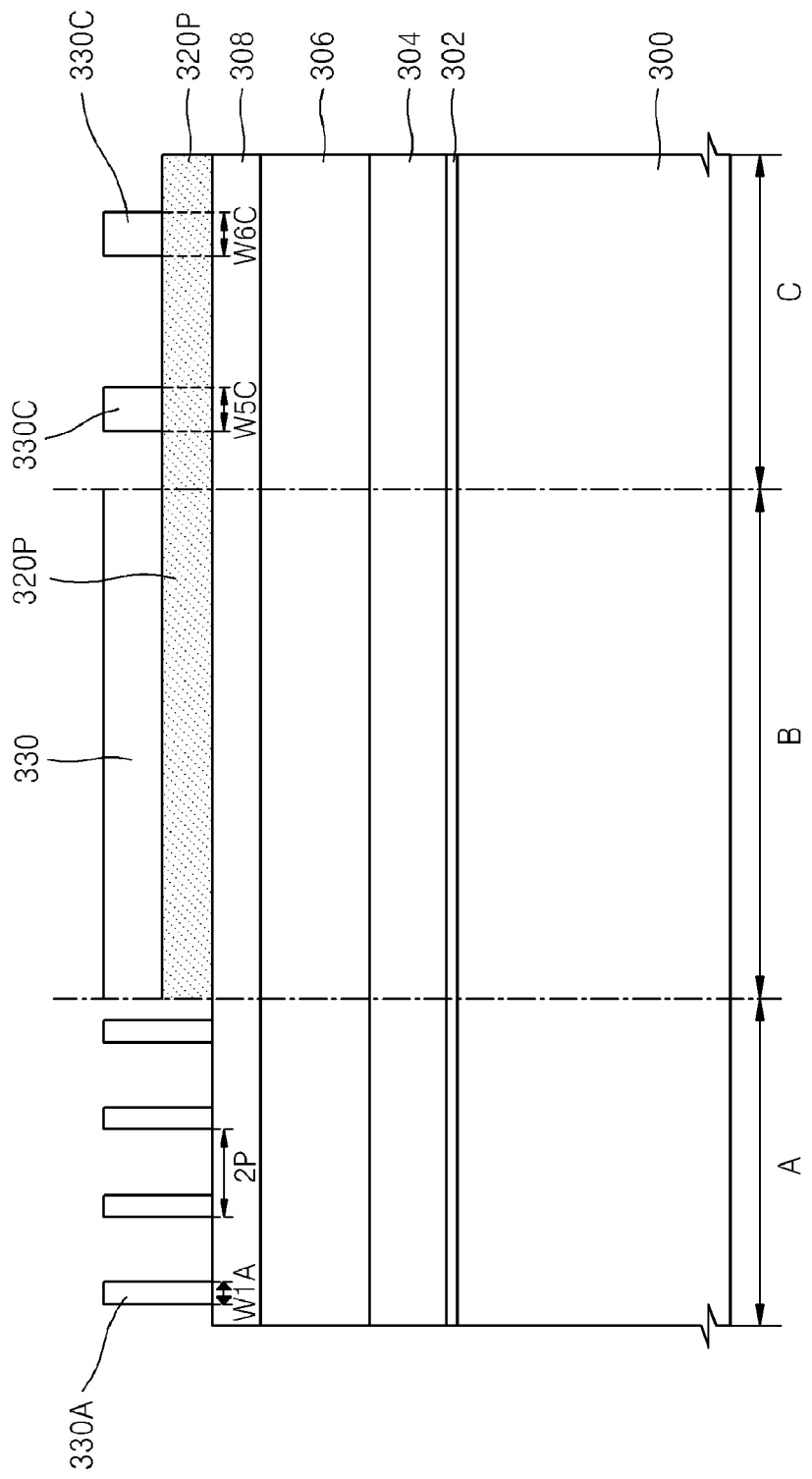

Referring to FIG. 5A, in the same manner as described with reference to FIGS. 3A-3C, a pad oxide film 302, a first hard mask layer 304, a second hard mask layer 306, and a third hard mask layer 308 are sequentially formed on first, second, and third areas A, B, and C of the substrate 300. A low density mask layer 320 is formed on the third hard mask layer 308. Then, that part of the low density mask layer 320 which covers the first area A of the substrate 300 is removed so that a low density mask pattern 320P covering the third hard mask layer 308 in the second and third areas B and C is formed. Subsequently, a mold mask layer 330 is formed on the third hard mask layer 308 in the first area A and on the low density mask pattern 320P in the second and third areas B and C.

Then, the mold mask layer 330 is patterned in a manner similar to the method described with reference to FIG. 3D. In the present embodiment, however, unlike the embodiment described with reference to FIGS. 3A-3J, only the portions of the mold mask layer 330 in the first and third areas A and C are removed whereas the portion of the mold mask layer 330 in the second area B is left in place. As a result, a mold mask pattern 330A having narrow topographic features is formed on the third hard mask layer 308 in the first area A and the key generation mold mask pattern 330C is formed on the low density mask pattern 320P in the third area C.

Referring to FIG. 5B, a spacer mask layer 340 is formed in the first, second, and third areas A, B, and C in the same manner as described with reference to FIG. 3E. The spacer mask layer 340 covers the upper surfaces and side walls of each of the narrow topographic features of the mold mask pattern 330A formed in the first area A, the mold mask layer 330 formed in the second area B, and the topographic features of the key generation mold mask pattern 330C formed in the third area C, with a uniform thickness.

Referring to FIG. 5C, the spacer mask layer 340 is etched back in the same manner as described with reference to FIG. 3F. As a result, first spacers 340A are formed on the second hard mask layer 308 over the side walls of each of the narrow topographic features of the mold mask pattern 330A in the first area A, and third spacers 340C are formed on the low density mask pattern 320P. The upper surface of the mold mask layer 330 remains exposed in the second area B.

During the etch back process, the low density mask pattern 320P is exposed laterally outwardly of respective sets of the third spacers 340C. The low density mask pattern 320P is formed of material that is substantially the same as that which makes up the spacer mask layer 340. Thus, after the low density mask pattern 320P is exposed in the third area C, the spacer mask layer 340 continues to be etched back until the third hard mask layer 308 is exposed in the first area A. While the first spacers 340A are being formed, the portions of the low density mask pattern 320P exposed in the third area C are etched. Consequently, portions of the third hard mask layer 308 are exposed in the third area C.

As a result, a low density mask pattern 320C is formed in the third area C. Each topographical feature of the low density mask pattern 320C has a width W15 or W16 corresponding to the sum of the width of a topographic feature of the key generation mold mask pattern 330C and the widths of the third spacers 340C covering the side walls of the topographic feature of the key generation mold mask pattern 330C. The widths W15 and W16 may correspond to the widths W5 and W6 of the third active region 230 (FIG. 2).

Figure 5D:
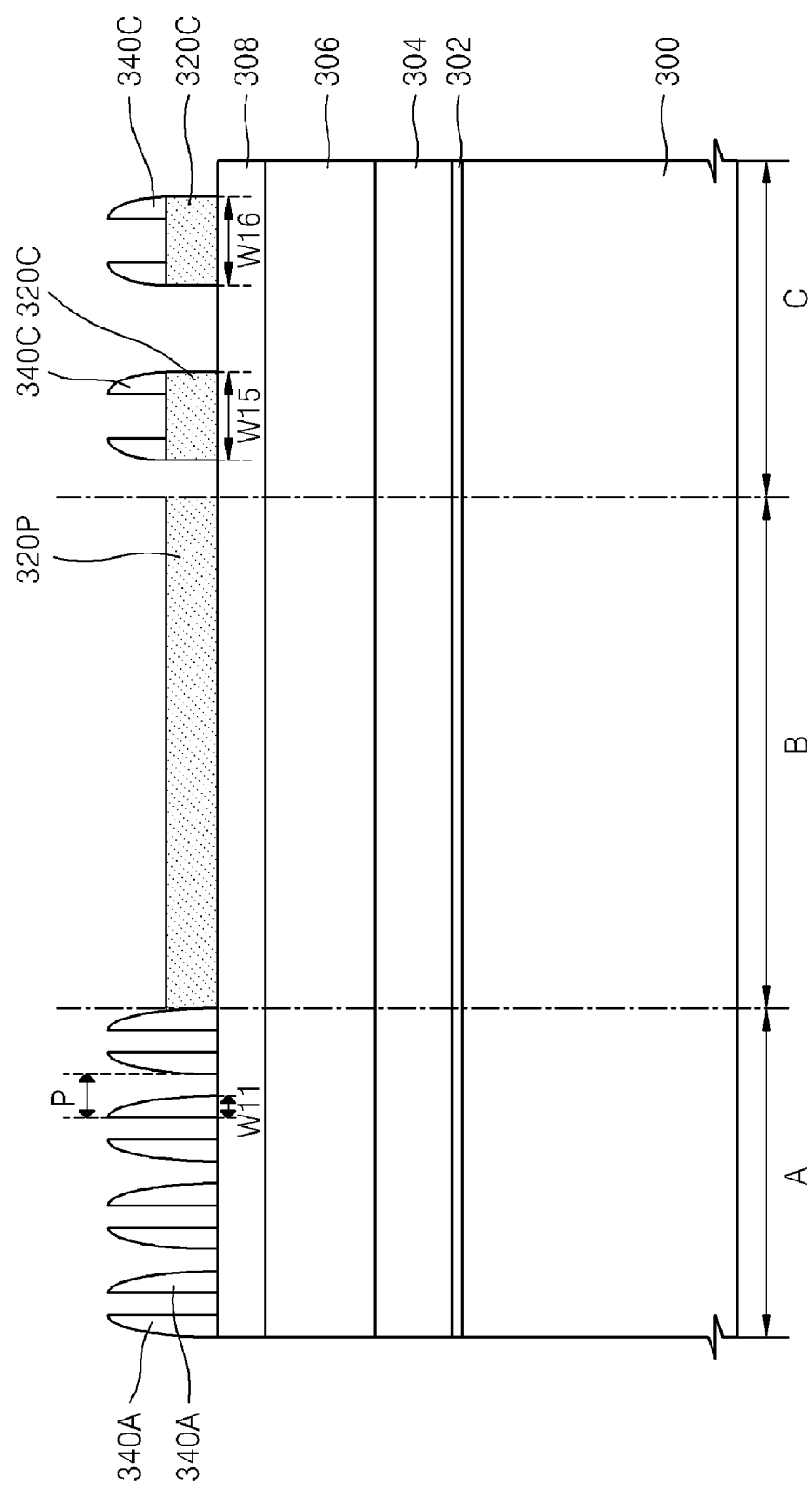

Referring to FIG. 5D, in a manner similar to the method described with reference to FIG. 3G, the narrow topographic features of the mold mask pattern 330A, the mold mask layer 330, and the key generation mold mask pattern 330C are respectively etched (removed) from the first, second, and third areas A, B, and C. At this time, the spacers 340A and 340C, the third hard mask layer 308, and the low density mask patterns 320P and 320C are not etched (removed).

Figure 5E:
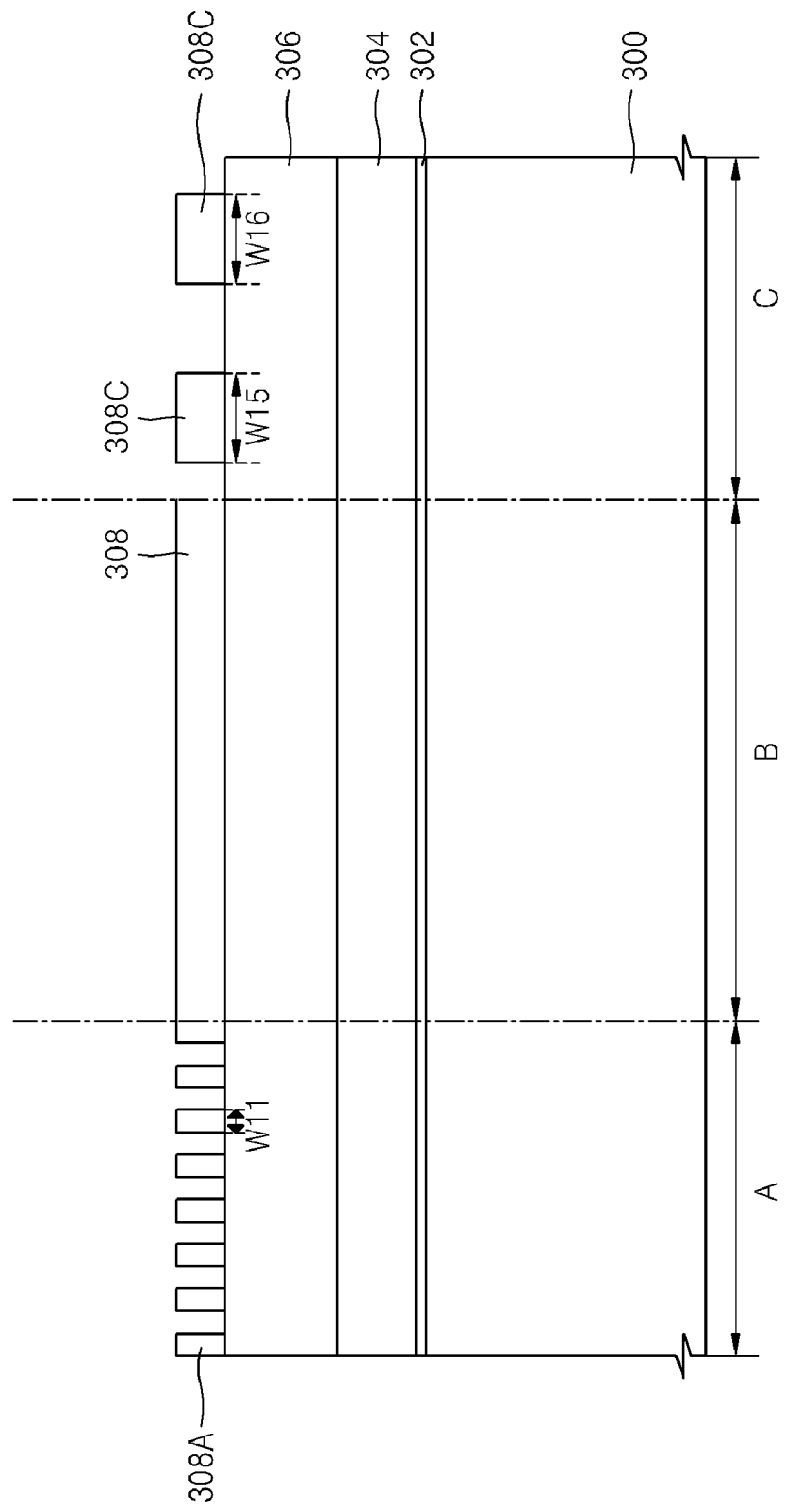

Referring to FIG. 5E, the third hard mask layer 308 is etched using the first spacers 340A in the first area A, the low density mask pattern 320P in the second area B, and the low density mask pattern 320C in the third area C as etch masks. Thus, third hard mask patterns 308A and 308C, which expose the second hard mask layer 306, are respectively formed in the first and third areas A and C. In the second area B, the third hard mask layer 308 is left unchanged. Although it is not shown in FIG. 5E, the first spacers 340A, the third spacers 340C, and the low density mask patterns 320P and 320C may be left on the upper surfaces of the third hard mask patterns 308A and 308C in the first and third areas A and C and on the upper surface of the third hard mask layer 308 in the second area B.

Figure 5F:
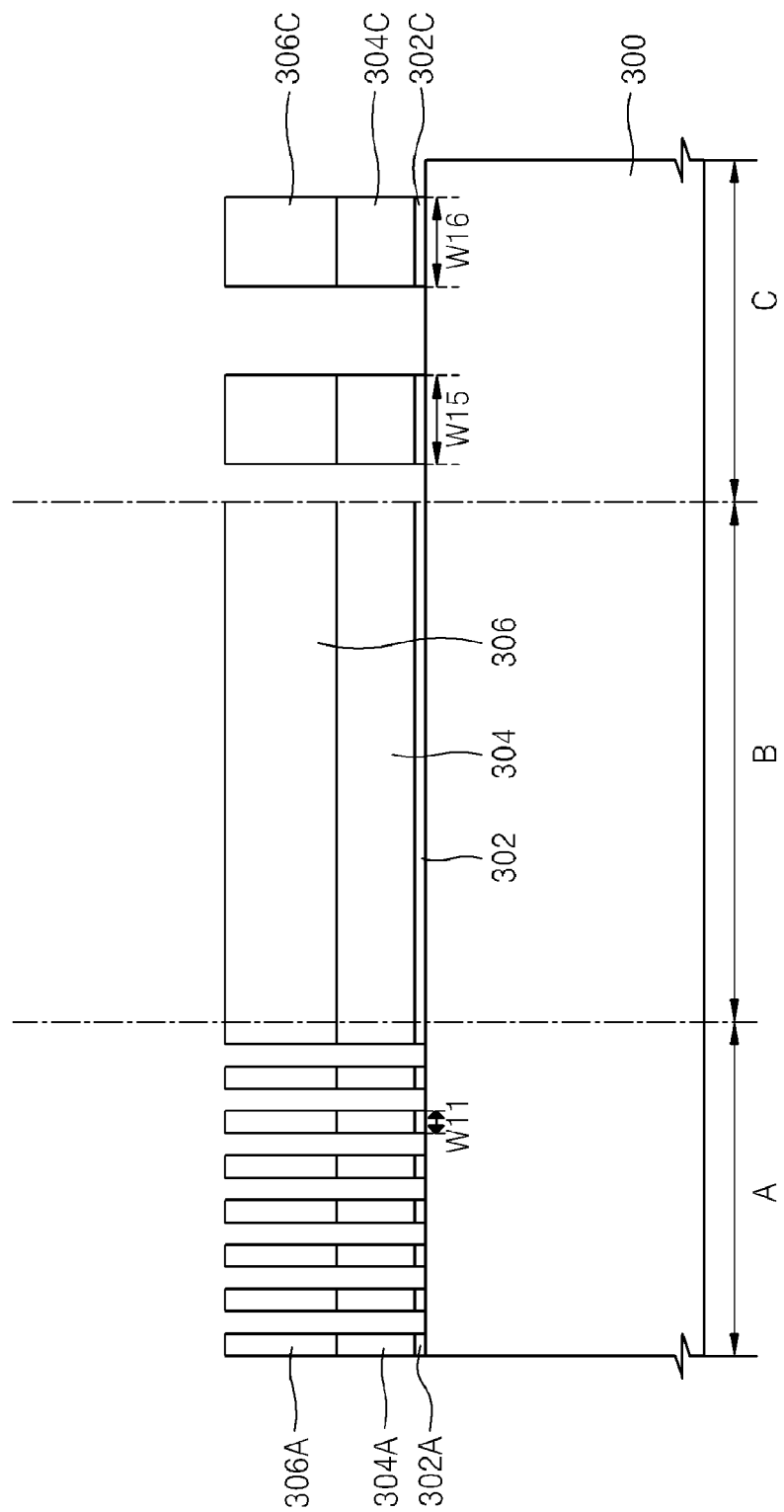

Referring to FIG. 5F, in a manner similar to the method described with reference to FIG. 3I, the second hard mask layer 306, the first hard mask layer 304, and the pad oxide film 302 are etched using the third hard mask patterns 308A and 308C, respectively, in the first and third areas A and C as etch masks. Thus, second hard mask patterns 306A and 306C, first hard mask patterns 304A and 304C, and pad oxide film patterns 302A and 302C, which expose the substrate 300, are formed in the first and third areas A and C. In the second area B, the pad oxide film 302, the first hard mask layer 304, and the second hard mask layer 306 remain unchanged. Although it is not shown in FIG. 5F, the third hard mask patterns 308A and 308C and the third hard mask layer 308 may remain on the upper surfaces of the second hard mask patterns 306A and 306C, respectively, in the first and third areas A and C and on the upper surface of the second hard mask layer 306 in the second area B.

Referring to FIG. 5G, a wide opening mask pattern 520 is formed on the resulting intermediate product. In the first and third areas A and C, the upper surfaces of the second hard mask patterns 306A and 306C and the substrate 300 are covered by the wide opening mask pattern 520. In the second area B, the upper surface of the second hard mask layer 306 is exposed by the wide opening mask pattern 520 above a location where an isolation trench is to be formed in the substrate 300. The wide opening mask pattern 520 may be a photoresist pattern.

Figure 5H:
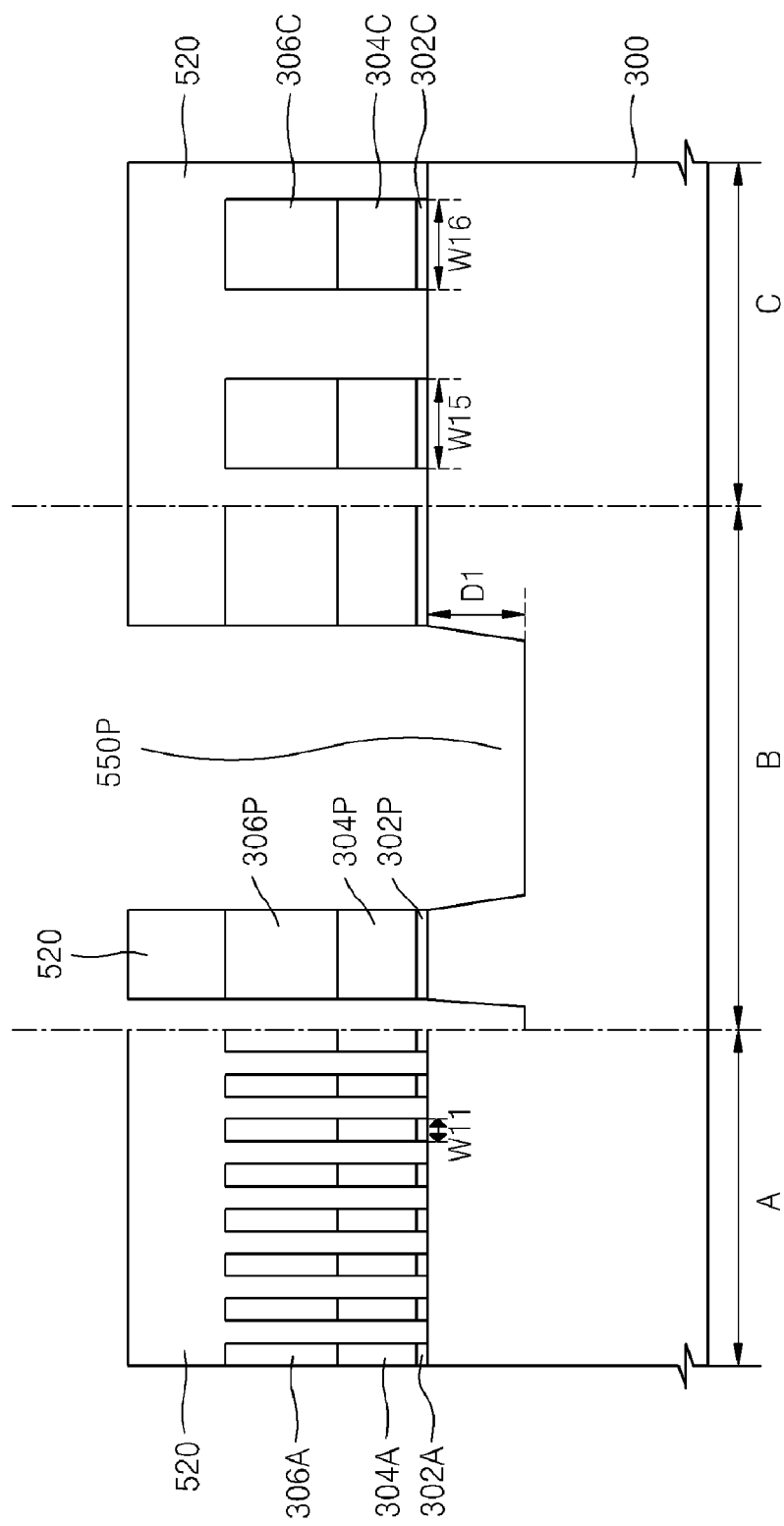

Referring to FIG. 5H, the portion of the second hard mask layer 306 exposed in the second area B is etched using the wide opening mask pattern 520 as an etch mask. Then, the first hard mask layer 304, which is exposed as a result of the etching of the second hard mask layer 306 and the pad oxide film 302 under the first hard mask layer 304, are sequentially etched. Accordingly, a pad oxide film 302P, a first hard mask pattern 304P, and a second hard mask pattern 306P are formed in the second area B. The substrate 300 exposed as a result is etched so that a wide trench 550P having a depth D1 is formed in the second area B.

Figure 5I:
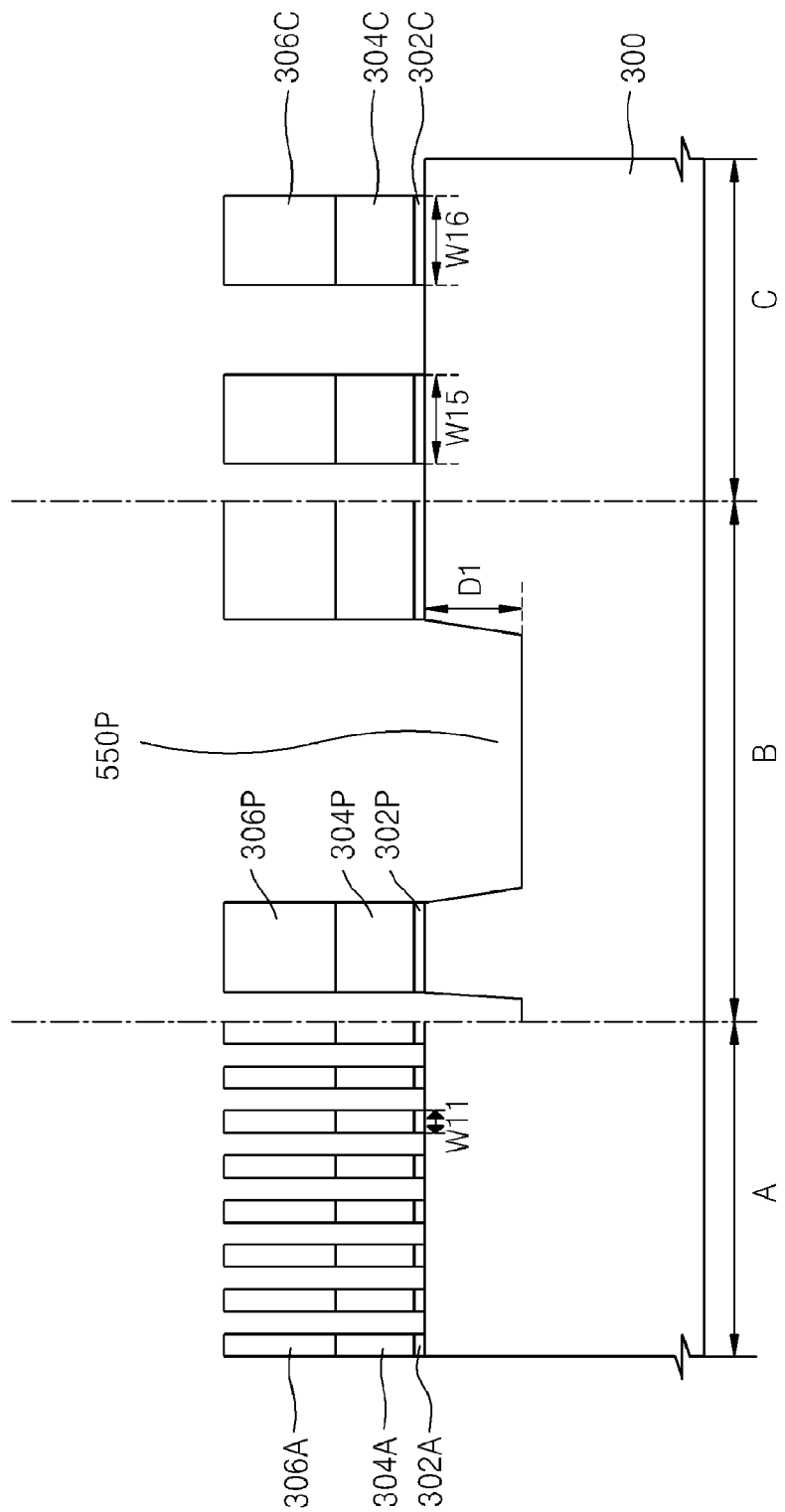

Referring to FIG. 5I, the upper surfaces of the second hard mask patterns 306A, 306P, and 306C, the first hard mask patterns 304A, 304P, and 304C, the pad oxide film patterns 302A, 302P, and 302C, and the substrate 300 in the first, second, and third areas A, B, and C are exposed by removing the wide opening mask pattern 520.

Figure 5J:
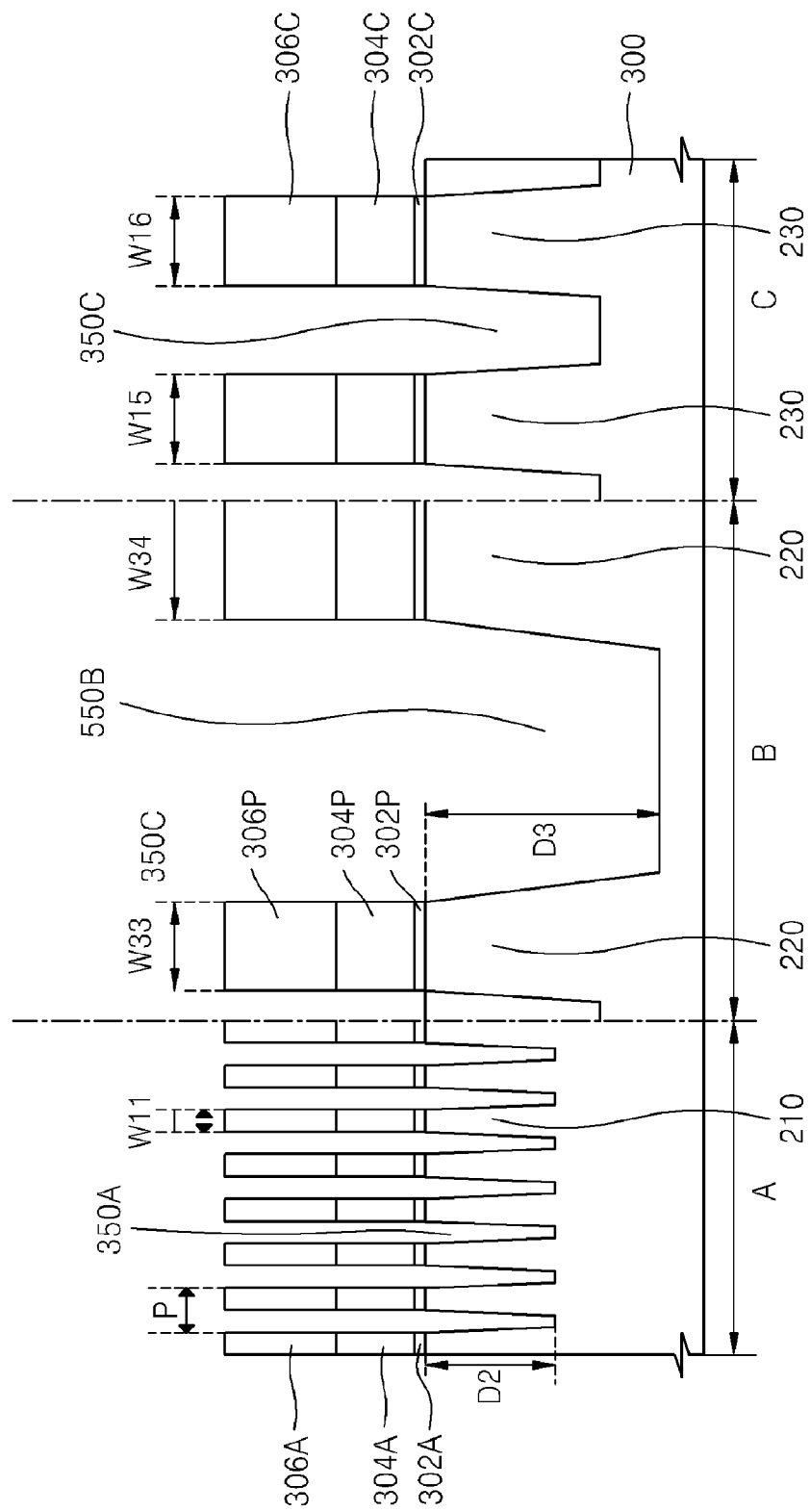

Referring to FIG. 5J, the substrate 300 is etched using the second hard mask patterns 306A, 306P, and 306C and first hard mask patterns 304A, 304P, and 304C as etch masks in the first, second, and third areas A, B, and C. As a result, first trenches 350A and third trenches 350C are simultaneously formed in the substrate 300 in the first and third areas A and C. The first and third trenches 350A and 350C may have depths corresponding to the widths thereof, that is, the dimensions in a direction parallel to a major surface of the substrate 300. Thus, the depths D2 of the first trenches 350A may be different than the depths of the third trenches 350C. In the present embodiment, the first trenches 350A are shallower than the third trenches 350C.

While the first and third trenches 350A and 350C are being respectively formed in the first and third areas A and C, the substrate 300 is also being etched in the second area B, i.e., the surface of the substrate 300 defining the bottom of the wide trench 550P is etched. Thus, a second trench 550B having a depth D3 that is greater than the first or second depth D1 or D2 may be formed. Then, an isolation layer (not shown) defining the first, second, and third active regions 210, 220, and 230 may be formed by filling the first, second, and third trenches 350A, 550B, and 350C with an insulation material. The portions of the isolation layer formed in each of the first, second, and third trenches 350A, 550B, and 350C constitute the first, second, and third isolation regions 214, 224, and 234 (FIG. 2).

In the embodiments of the method of forming patterns of a semiconductor device according to the present invention, as described above, patterns of different densities and whose (topographic) features have different widths are formed simultaneously on different areas of a substrate. More specifically, a high density pattern of narrow topographic features is formed by a double patterning process in one area of a substrate, and a low density pattern of relatively wide topographic features is formed in at least one other area on the substrate using photolithography. In particular, according to the present invention, an alignment key or an overlay key is formed on the substrate at the same time that narrow trenches which delimit the active region in the high density cell array area are formed. Furthermore, according to an aspect of the present invention described above in connection with the embodiment of FIGS. 5A-5J, the isolation characteristics of the device in the second area are enhanced by forming a trench in the second area which is deeper than the first trenches formed in the first area. Thus, the present invention is especially useful in the fabricating of a semiconductor device in which a high voltage component is formed in the second area.

Finally, although the present invention has been particularly shown and described with reference to the preferred embodiments thereof, it will be understood that various changes in form and details may be made therein without departing from the true spirit and scope of the invention as defined by the following claims.

What is claimed is:

1. A method in the fabrication of a semiconductor device having a first area, and a second area disposed laterally of the first area, the method comprising:
    forming, on a substrate which provides the first and second areas, a first mask pattern that includes at least one topographic feature in the second area;
    forming a mold mask pattern including a plurality of first topographic features in the first area, wherein each of the first topographic features has opposite sidewalls and an upper surface;
    forming first spacers which cover the side walls of each of the first topographic features of the mold mask pattern in the first area; and
    transcribing the pattern of the first spacers to a layer disposed thereunder in the first area to thereby form a pattern having a plurality of first transcribed topographic features, and simultaneously transcribing the pattern of the at least one topographic feature of the first mask pattern to a layer disposed under the first mask pattern in the second area to thereby form at least one second transcribed topographic feature,
    wherein the width, in a direction parallel to the major surface of the substrate, of each of the first transcribed topographic features is less than the width of the second transcribed topographic feature.

2. The method of claim 1 and as applied to the fabricating of a semiconductor device having a memory cell region that includes in the first area memory cells of the semiconductor device, and a peripheral circuit region that includes in the second area circuitry which drives the memory cells, wherein the transcribing of the pattern of the first spacers comprises transcribing the pattern of the first spacers to the memory cell region, and the transcribing of the pattern of the at least one topographic feature of the mask pattern comprises transcribing the pattern of the at least one topographic feature of the mask pattern to the peripheral circuit region.

3. The method of claim 1, wherein the substrate includes a semiconductor substrate and a hard mask layer disposed on the semiconductor substrate, and the transcribing comprises:
   etching the hard mask layer using the first spacers and the first mask pattern together as an etch mask to thereby form a hard mask pattern in the first and second areas; and
   etching the semiconductor substrate using the hard mask pattern as an etch mask to thereby form a plurality of trenches in the first area, and at least one trench in the second area having a width that is greater than the width of each of the trenches in the first area.

4. The method of claim 1, further comprising removing the mold mask pattern after the first spacers are formed and before the transcribed patterns are formed.

5. The method of claim 4, wherein the substrate includes a semiconductor substrate and a hard mask layer disposed on the semiconductor substrate, and the transcribing comprises:
   etching the hard mask layer using the first spacers and the first mask pattern together as an etch mask to thereby form a hard mask pattern in the first and second areas,
   forming on the hard mask pattern a first opening-fabricating mask pattern that covers the first area and exposes part of an upper surface of the hard mask pattern in the second area,
   etching the hard mask pattern and the substrate in the second area using the first opening-fabricating mask pattern as an etch mask to thereby form a trench in the second area of the substrate,
   removing the first opening-forming mask pattern, and
   etching the semiconductor substrate in the first and second areas using the hard mask pattern as an etch mask to thereby form a plurality of trenches in the first area and at the same time increase the depth of the trench in the second area.

6. The method of claim 1, wherein the forming of the mold mask pattern comprises forming at least one second topographic feature on the first mask pattern in the second area while forming the plurality of first topographic features in the first area, and further comprising:
   forming second spacers covering side walls of the at least one second topographic feature in the second area, and removing that part of the first mask pattern not covered by the second spacers and the at least one topographic feature of the mold mask in the second area all while the first spacers are being formed in the first area.

7. The method of claim 1 and as applied to the fabricating of a semiconductor device having a third area that is disposed laterally of the first and second areas,
   wherein the forming of the first mask pattern comprises forming first key-fabricating topographic features in the third area at the same time the at least one topographic feature is formed in the second area,
   the forming of the mold mask pattern comprises forming key-fabricating mold topographic features on the first key-fabricating topographic features in the third area simultaneously with the forming of the topographic features of the mold mask pattern in the first area, and
   forming a plurality of spacers covering side walls of the key-fabricating mold mask pattern in the third area simultaneously with the forming of the plurality of first spacers in the first area, and further comprising:
   removing the topographic features of the mold mask pattern in the first and third areas; and
   transcribing the pattern of the first key-fabricating topographic features of the first mask pattern to a layer disposed thereunder in the third area to thereby form an alignment or overlay key in the third area, simultaneously with the transcribing in the first and second areas.

8. The method of claim 1, wherein the forming of the mold mask pattern in the first area comprises:
   forming a mold mask layer over the first and second areas, and
   patterning the mold mask layer in the first area without altering the mold mask layer in the second area.

9. A method in the fabrication of a semiconductor device having a first area, and a second area disposed laterally of the first area, the method comprising:
   forming, on a substrate that provides the first area and a second area, a hard mask layer;
   forming a first mask pattern on the hard mask layer in the second area;
   forming a mold mask pattern having a plurality of first topographic features on the hard mask layer in the first area, wherein each of the first topographic features has opposite sidewalls and an upper surface;
   forming first spacers which cover the side walls of each of the first topographic features of the mold mask pattern in the first area;
   removing the first topographic features;
   etching the hard mask layer using the first spacers in the first area as an etch mask, and removing the hard mask pattern from the hard mask layer in the second area to thereby form a plurality of first transcribed topographic features in the first area;
   forming an opening-fabricating mask pattern that covers the first transcribed topographic features in the first area and defines an opening in the second area;
   etching the substrate in the second area using the opening-fabricating mask pattern as an etch mask to thereby form a trench in the second area;
   removing the opening-fabricating mask pattern; and
   simultaneously etching the substrate in the first and second areas using the first transcribed topographic features in the first area as an etch mask to simultaneously form a plurality of trenches in the substrate in the first area and increase the depth of the trench in the substrate in the second area.

10. The method of claim 9, wherein the forming of the mold mask pattern comprises:
   forming a mold mask layer on the substrate which occupies both the first and second areas; and
   patterning the mold mask layer in the first area without altering the mold mask layer in the second area, and
   wherein that part of the mold mask layer which occupies the second area is removed simultaneously with the first topographic features of the mold mask pattern.

11. A method in the fabrication of a semiconductor device having a first area, and a second area disposed laterally of the first area, the method comprising:
- forming a hard mask layer on a substrate that provides the first area and a second area;
- forming a mask layer on the hard mask layer;
- removing a portion of the mask layer in the first area, the mask layer remaining in the second area;
- forming a plurality of mold mask patterns on the hard mask layer in the first area and on the mask layer in the second area;
- forming a spacer mask layer on the plurality of mold mask patterns in the first area and the second area;
- performing an etching process to etch the spacer mask layer so that spacers remain at sidewalls of the plurality of mold mask patterns in the first area and the second area and to etch the mask layer in the second area to provide mask layer patterns in the second area;
- etching the hard mask layer using the spacers as an etch mask in the first area and using the mask layer patterns as an etch mask in the second area to thereby form a hard mask pattern in the first area and the second area; and
- etching the substrate using the hard mask pattern as an etch mask to thereby form a plurality of trenches in the first area, and at least one trench in the second area having a width that is greater than a width of each of the trenches in the first area.

12. The method of claim 11, wherein the performing an etching process to etch the mask layer in the second area is performed using the mold mask patterns and spacers as an etch mask.

13. The method of claim 11, wherein the trench in the second area has a depth that is greater than depths of the trenches in the first area.

14. The method of claim 11, wherein the semiconductor device is a memory device, wherein the first area is a memory cell area, and wherein the second area is a peripheral circuit area including peripheral circuits for driving memory cells in the memory cell area.

15. The method of claim 11, further comprising removing the plurality of mold mask patterns after the spacers and the mask layer patterns are formed and before the hard mask pattern is formed.

16. The method of claim 11, wherein the plurality of mold mask patterns comprise a first mold mask pattern formed on the hard mask layer in the first area and a second mold mask pattern formed on the mask layer in the second area, the first mold mask pattern having a width that is smaller than a width of the second mold mask pattern.

17. The method of claim 11, wherein the spacers comprise a first spacer formed on the sidewall of the mold mask pattern in the first area and a second spacer formed on the sidewall of the mold mask pattern in the second area, and
- wherein the second spacer and the mask layer patterns in the second area are formed during forming of the first spacer in the first area.

18. The method of claim 11, wherein the substrate further includes a key area that is separated from the first and second areas and disposed laterally of the first and second areas, and
- wherein the mask layer is remained in the second area and the key area after the removing a portion of the mask layer in the first area,
- the method further comprising:
- forming a key generation mold mask pattern on the mask layer in the key area simultaneously with the forming of the plurality of mold mask patterns in the first and second areas;
- forming a third spacer covering sidewalls of the key generation mold mask pattern in the key area and removing a part of the mask layer in the key area to provide a key generation mask layer pattern in the key area simultaneously with the performing an etching process to etch the spacer mask layer;
- etching the hard mask layer using the key generation mask layer pattern as an etch mask in the key area to thereby form a key hard mask pattern in the key area simultaneously with the forming of the hard mask pattern in the first and second areas; and
- etching the substrate using the key hard mask pattern in the key area to thereby form a third trench in the key area simultaneously with the etching the substrate in the first and second areas.

19. The method of claim 18, wherein the removing a part of the mask layer in the key area to provide a key generation mask layer pattern in the key area comprises performing an etching process to etch the mask layer in the key area using the key generation mold mask pattern and the third spacer as an etch mask.

20. The method of claim 18, wherein the third trench in the key area has a depth that is greater than depths of the trenches in the first area.

* * * * *